(12) United States Patent
Yu et al.

(10) Patent No.: US 12,316,279 B2
(45) Date of Patent: May 27, 2025

(54) AMPLIFIER CIRCUIT WITH AN ENVELOPE ENHANCEMENT

(71) Applicant: Intel Corporation, Santa Clara, CA (US)

(72) Inventors: Chuanzhao Yu, Phoenix, AZ (US); LiChung Chang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 827 days.

(21) Appl. No.: 17/355,205

(22) Filed: Jun. 23, 2021

(65) Prior Publication Data

US 2022/0416722 A1 Dec. 29, 2022

(51) Int. Cl.
| | |
|---|---|
| *H03G 3/20* | (2006.01) |
| *H03F 1/02* | (2006.01) |
| *H03F 3/24* | (2006.01) |
| *H04B 1/40* | (2015.01) |
| *H03F 1/56* | (2006.01) |

(52) U.S. Cl.
CPC ........... *H03F 1/0216* (2013.01); *H03F 3/245* (2013.01); *H04B 1/40* (2013.01); *H03F 1/565* (2013.01); *H03F 2200/102* (2013.01); *H03F 2200/222* (2013.01); *H03F 2200/451* (2013.01)

(58) Field of Classification Search
CPC ........ H03F 1/0216; H03F 3/245; H03F 1/565; H03F 2200/102; H03F 2200/222; H03F 2200/451; H03F 1/0266; H03F 2200/61; H03F 2203/45024; H03F 3/193; H03F 3/45201; H03F 2203/45052; H03F 2203/45302; H03F 1/223; H04B 1/40; H03G 3/20
USPC .......................................... 330/129, 136, 311
See application file for complete search history.

(56) References Cited

U.S. PATENT DOCUMENTS

| | | | | |
|---|---|---|---|---|
| 7,164,321 | B2 * | 1/2007 | Behzad | H03F 1/0261 330/311 |
| 8,665,027 | B2 * | 3/2014 | Pai | H03F 1/3205 330/285 |
| 8,872,590 | B2 * | 10/2014 | Kan | H03F 1/223 330/311 |
| 9,219,445 | B2 * | 12/2015 | Nobbe | H03F 1/0205 |

* cited by examiner

*Primary Examiner* — Henry Choe
(74) *Attorney, Agent, or Firm* — Viering, Jentschura & Partner mbB

(57) ABSTRACT

Amplifier circuits, radio communication circuits, radio communication devices, and methods provided in this disclosure provide an amplifier circuit. The amplifier circuit may include an amplifier configured to amplify an input signal to provide an output signal. The amplifier circuit may further include an amplifier stack including a first transistor coupled to the amplifier. The amplifier stack may be configured to receive the output signal to amplify the output signal. The amplifier stack may be configured to receive an input control signal to control the first transistor based on an envelope of the input signal.

21 Claims, 12 Drawing Sheets

AMPLIFIER CIRCUIT WITH AN ENVELOPE ENHANCEMENT

TECHNICAL FIELD

Various aspects of this disclosure generally relate to an amplifier circuit, a radio communication circuit, a radio communication device, and a method.

BACKGROUND

The communication devices communicate by transmitting and receiving communication signals to exchange information. Transmitters of radio communication devices should in principal be able to transmit the radio communication signals with the necessary power so that the transmitter can deliver the radio communication signals properly to a corresponding receiver which is going to receive the radio communication signal Amplifiers are traditionally used to increase the power of radio communication signals in radio communication devices. A transmitter and/or a receiver may include one or more amplifiers to provide the amplification to increase the power of the communication signal that is to be transmitted or received.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosure. In the following description, various aspects of the disclosure are described with reference to the following drawings, in which.

DESCRIPTION

Figure 1:
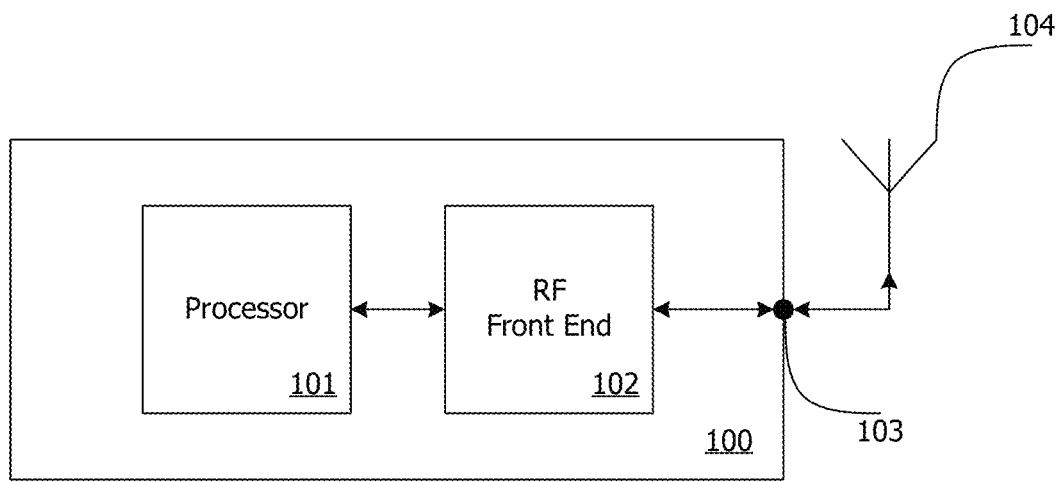
FIG. 1 shows schematically a block diagram of an example of a radio communication device.

The following detailed description refers to the accompanying drawings that show, by way of illustration, exemplary details and aspects in which aspects of the present disclosure may be practiced.

Amplifiers are traditionally used to increase the power of a communication signal, and a transmitter and/or a receiver may include one or more amplifiers to provide the amplification to increase the power of the communication signal that is to be transmitted or received. The design of such amplifiers may be challenging, especially considering market demands to increase bandwidth by various methods, such as wideband radio communication signals, the wide adaptation of radio communication with frequency channels over 1 GHz, and millimeter-wave, that introduce further challenges especially in terms of amplifier gain, linearity, power efficiency, and power consumption. Accordingly, it may be desirable to develop an amplifier which may address at least one of these challenges.

In general, the essential task performed by an amplifier is to increase the power of a signal, however, there are many considerations that should have been taken to provide the amplification with an amplifier, such as the "linearity" of the amplifier, which is sometimes referred as "fidelity" based on the type of the amplifier. The term refers to provide the amplification to the input signal without changing the characteristics of the input signal, for example, based on the frequency and amplitude of a component of the input signal. An ideal amplifier would provide the same amplification (i.e. with the same gain) for every component of the input signal in terms of linearity.

There are many further concerns that may be of similar importance as the linearity for the amplifiers, such as the gain of the amplifier, the output power provided by the amplifier, the bandwidth which the amplifier is intended to operate, the efficiency of the amplifier in terms of power (i.e. power efficiency), impedance matching, and the amount of power dissipated by heat. Accordingly, an amplifier should meet certain expectations for various aspects based on the conditions in which the amplifier is intended to operate.

Exemplarily, low-noise amplifiers (LNA) are used in telecommunication by communication devices to amplify a very low-power signal without introducing any degradation to the signal-to-noise ratio (SNR) of the input signal at very low power. It is generally unavoidable introducing any noise when amplifying a signal, and an input signal at very low power may be particularly susceptible to the noise. Accordingly, low-noise amplifiers are designed to minimize the noise that is introduced by the amplifier using various methods. For example, receivers of radio communication signals usually include low noise amplifiers to amplify received signals which may be at very low power levels.

Further, power amplifiers are commonly used in telecommunication by communication devices, which are designed primarily to increase the power available to a load that allows maximum voltage and/or current swing, and in particular radio frequency (RF) power amplifiers that are provided to convert a low-power radio frequency (RF) signal and optimizing impedances for power transfer into a higher power signal to be transmitted by an antenna. The radio frequency (RF) power amplifiers generally include solid-state devices, mainly metal-oxide-semiconductor field-effect-transistors (MOSFET).

Exemplarily, various methods are used to increase the output power of a power amplifier, that may include increasing the size of the communication device periphery, which would provide challenges regarding impedance matching in a manner that may prevent power efficient applications, and/or concerns with respect to form-factor of the devices including such power amplifiers.

Alternatively, a plurality of amplifiers may be combined in a manner that multiple amplifiers providing amplification to an input signal to increase the output power and load impedance of the power amplifier simultaneously. Exemplarily, the plurality of amplifiers may include stacked power amplifiers which are coupled together to provide a collective amplification. Stacked power amplifiers may be more reliable than providing the same amount of amplification using one single amplifier, however, the distortion of stacked amplifiers, or stacked amplifier stages, may degrade the linearity performance of the amplifier.

In various examples, an amplifier, or an amplifier circuit, may include one or more stacked stages coupled to a transconductance amplifier. Transconductance amplifiers supplied by direct current (DC) voltage may be configured to provide direct current (DC) at relatively high levels to boost the gain and linearity, which may result in increased static and dynamic currents in the one or more stacked stages coupled to the transconductance amplifier. Additionally, the differences of the envelope signals at the one or more stacked stages, at the drain, gate, or source terminals of one or more metal-oxide-semiconductor field-effect-transistors (MOSFET) of the stacked stages may provide challenges in terms of linearity of the one or more metal-oxide-semiconductor field-effect-transistors (MOSFET), which may result in degraded linearity.

The following detailed description refers to the accompanying drawings that show, by way of illustration, specific details and aspects in which the disclosure may be practiced.

The word "exemplary" is used herein to mean "serving as an example, instance, or illustration". Any aspect or design described herein as "exemplary" is not necessarily to be construed as preferred or advantageous over other aspects or designs.

The words "plurality" and "multiple" in the description or the claims expressly refer to a quantity greater than one. The terms "group (of)", "set [of]", "collection (of)", "series (of)", "sequence (of)", "grouping (of)", etc., and the like in the description or in the claims refer to a quantity equal to or greater than one, i.e. one or more. Any term expressed in plural form that does not expressly state "plurality" or "multiple" likewise refers to a quantity equal to or greater than one. The terms "proper subset", "reduced subset", and "lesser subset" refer to a subset of a set that is not equal to the set, i.e. a subset of a set that contains fewer elements than the set.

The term "transistor" used in accordance with this disclosure may be any kind of transistor including N-type metal-oxide semiconductors (NMOS), P-type metal-oxide semiconductors, bipolar junction transistors (BJT), field-effect transistors (FET), junction-field effect transistors (JFET), metal oxide semiconductor field-effect transistors (MOSFET), etc. The one or more transistors may include complementary metal-oxide semiconductors (CMOS) or any other similar complementary structures. The terminals of the transistors used in accordance with the disclosure may refer to field-effect transistors (FET), such as they include a gate terminal, a source terminal, and a drain terminal. The skilled person would know that in case of an adaptation to another type of transistor, the terminal names may be different.

The term "amplifier" utilized herein refers to any type of component, circuit, module, or device which amplifies (i.e. increase power/amplitude) an input signal and may provide an amplified signal as an output signal. The amplifier may be any type of amplifier, an amplifier stack, or an amplifier stage.

As used herein, "memory" is understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, registers, shift registers, processor registers, data buffers, etc., are also embraced herein by the term memory. A single component referred to as "memory" or "a memory" may be composed of more than one different type of memory, and thus may refer to a collective component including one or more types of memory. Any single memory component may be separated into multiple collectively equivalent memory components, and vice versa. Furthermore, while memory may be depicted as separate from one or more other components (such as in the drawings), memory may also be integrated with other components, such as on a common integrated chip or a controller with an embedded memory.

The term "software" refers to any type of executable instruction, including firmware.

The term "radio communication device" utilized herein refers to any devices using radio frequency signals for communication including user-side devices (both portable and fixed) that can connect to a core network and/or external data networks via a radio access network. "Radio communication device" can include any mobile or immobile wireless communication device, including User Equipment (UEs), Mobile Stations (MSs), Stations (STAs), cellular phones, tablets, laptops, personal computers, wearables, multimedia playback, and other handheld or body-mounted electronic devices, consumer/home/office/commercial appliances, vehicles, and any other electronic device capable of user-side wireless communications. Without loss of generality, in some cases terminal devices can also include application-layer components, such as application processors or other general processing components that are directed to functionality other than wireless communications. Radio communication devices can optionally support wired communications in addition to wireless communications. Furthermore, radio communication devices can include vehicular communication devices that function as radio communication devices.

Various aspects of this disclosure may utilize or be related to radio communication technologies. While some examples may refer to specific radio communication technologies, the examples provided herein may be similarly applied to various other radio communication technologies, both existing and not yet formulated, particularly in cases where such radio communication technologies share similar features as disclosed regarding the following examples. As used herein, a first radio communication technology may be different from a second radio communication technology if the first and second radio communication technologies are based on different communication standards.

Aspects described herein may use such radio communication technologies according to various spectrum management schemes, including, but not limited to, dedicated licensed spectrum, unlicensed spectrum, (licensed) shared spectrum (such as LSA, "Licensed Shared Access," in 2.3-2.4 GHz, 3.4-3.6 GHz, 3.6-3.8 GHz and further frequencies and SAS, "Spectrum Access System," in 3.55-3.7 GHz and further frequencies), and may be use various spectrum bands including, but not limited to, IMT (International Mobile Telecommunications) spectrum (including 450-470 MHz, 790-960 MHz, 1710-2025 MHz, 2110-2200 MHz, 2300-2400 MHz, 2500-2690 MHz, 698-790 MHz, 610-790 MHz, 3400-3600 MHz, etc., where some bands may be limited to specific region(s) and/or countries), IMT-advanced spectrum, IMT-2020 spectrum (expected to include 3600-3800 MHz, 3.5 GHz bands, 700 MHz bands, bands within the 24.25-86 GHz range, etc.), spectrum made available under FCC's "Spectrum Frontier" 5G initiative (including 27.5-28.35 GHz, 29.1-29.25 GHz, 31-31.3 GHz, 37-38.6 GHz, 38.6-40 GHz, 42-42.5 GHz, 57-64 GHz, 64-71 GHz, 71-76 GHz, 81-86 GHz and 92-94 GHz, etc.), the ITS (Intelligent Transport Systems) band of 5.9 GHz (typically 5.85-5.925 GHz) and 63-64 GHz, bands currently allocated to WiGig such as WiGig Band 1 (57.24-59.40 GHz), WiGig Band 2 (59.40-61.56 GHz) and WiGig Band 3 (61.56-63.72 GHz) and WiGig Band 4 (63.72-65.88 GHz), the 70.2 GHz-71 GHz band, any band between 65.88 GHz and 71 GHz, bands currently allocated to automotive radar applications such as 76-81 GHz, and future bands including 94-300 GHz and above.

For purposes of this disclosure, radio communication technologies may be classified as one of a Short-Range radio communication technology or Cellular Wide Area radio communication technology. Short Range radio communication technologies may include Bluetooth, WLAN (e.g., according to any IEEE 802.11 standard), and other similar radio communication technologies. Cellular Wide Area radio communication technologies may include Global System for Mobile Communications (GSM), Code Division Multiple Access 2000 (CDMA2000), Universal Mobile Telecommunications System (UMTS), Long Term Evolution (LTE), General Packet Radio Service (GPRS), Evolution-Data Optimized (EV-DO), Enhanced Data Rates for GSM Evolution (EDGE), High Speed Packet Access (HSPA; including High Speed Downlink Packet Access (HSDPA), High Speed Uplink Packet Access (HSUPA), HSDPA Plus (HSDPA+), and HSUPA Plus (HSUPA+)), Worldwide Interoperability for Microwave Access (WiMax) (e.g., according to an IEEE 802.16 radio communication standard, e.g., WiMax fixed or WiMax mobile), etc., and other similar radio communication technologies. Cellular Wide Area radio communication technologies also include "small cells" of such technologies, such as microcells, femtocells, and picocells. Cellular Wide Area radio communication technologies may be generally referred to herein as "cellular" communication technologies.

The terms "radio communication network," "wireless network", "communication network," or the like, as utilized herein encompasses both an access section of a network (e.g., a radio access network (RAN) section) and a core section of a network (e.g., a core network section).

Unless explicitly specified, the term "transmit" encompasses both direct (point-to-point) and indirect transmission (via one or more intermediary points). Similarly, the term "receive" encompasses both direct and indirect reception. Furthermore, the terms "transmit", "receive", "communicate", and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as radio frequency (RF) transceivers and antennas, and the logical transmission and reception over the software-level connection is performed by the processors or controllers. The term "communicate" may encompass one or both of transmitting and receiving, i.e., unidirectional or bidirectional communication in one or both of the incoming and outgoing directions. The term "calculate" may encompass both 'direct' calculations via a mathematical expression/formula/relationship and 'indirect' calculations via lookup or hash tables and other array indexing or searching operations.

FIG. 1 shows schematically a block diagram of an example of a radio communication device 100. The radio communication device 100 includes a processor 101. A radio frequency (RF) front end 102 is coupled to the processor 101 and an antenna port 103. The antenna port 103 may be coupled to an antenna 104. The communication device 100 may include a plurality of processors, a plurality of radio frequency (RF) front ends, a plurality of antenna ports, and a plurality of antennas.

For transmitting function, the processor 101 provides signals to be transmitted to the radio frequency (RF) front end 102. The radio frequency (RF) front end 102 may receive the signals from the processor 101. The radio frequency (RF) front end 102 provides the radio frequency (RF) communication signals to the antenna port 103 so that the antenna 104 receives the radio frequency (RF) communication signals from the antenna port 103 and transmits the radio communication signals. Exemplarily, the radio frequency (RF) front end 102 may include an upconverter to convert received signals to the radio frequency (RF) communication signals. The radio frequency (RF) front end 102 includes a power amplifier.

For receiving function, the antenna port 103 receives radio frequency (RF) communication signals from the antenna 104. The radio frequency (RF) front end 102 receives the radio frequency (RF) communication signals from the antenna port 103. The radio frequency (RF) front end may 102 include a downconverter to convert the radio frequency (RF) communication signals. The radio frequency (RF) front end 102 provides its output to the processor 101 which may receive baseband communication signals and decode the baseband communication signals.

The radio communication device 100 is only provided as an example of a radio communication device capable of performing both a transmitting function and a receiving function. A radio communication device may exemplarily be capable of performing only one of these functions (i.e. as a receiver or transmitter), and various aspects provided with this disclosure may apply in these examples as well.

The radio communication device 100 may communicate with a radio communication network, or other radio communication devices and/or network access nodes. Although the communication may take place in compliant with certain examples described herein which refer to a particular radio access network context (e.g., WLAN/WiFi, 5G, NR, LTE, or other 3rd Generation Partnership Project (3GPP) networks, Bluetooth, mmWave, etc.), these examples are demonstrative and may therefore be readily applied to any other type or configuration of radio access network.

Figure 2:
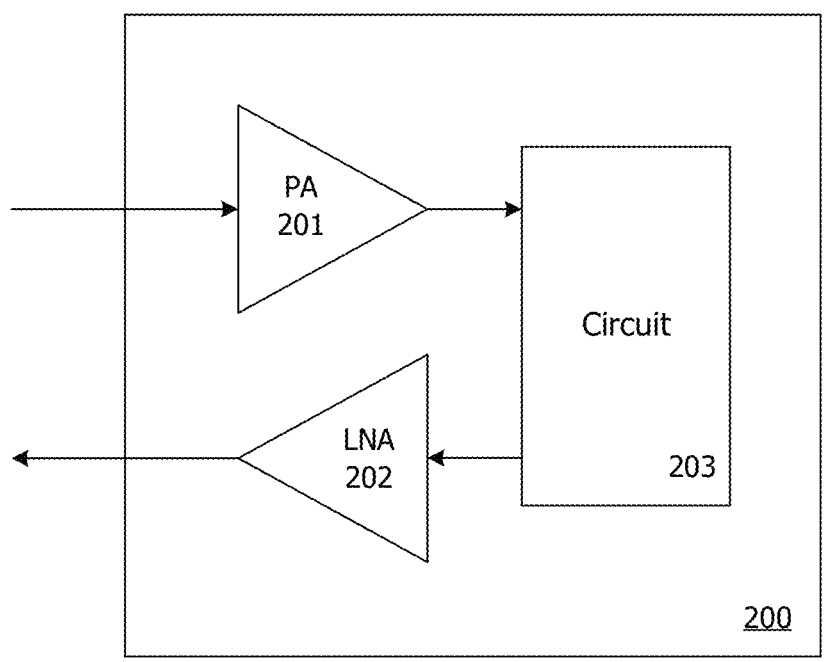
FIG. 2 shows schematically a block diagram of an example RF front end in a radio communication device including a transmitter and a receiver.

FIG. 2 shows schematically a block diagram of an example radio frequency (RF) front end 200 that may be implemented in a radio communication device including a transmitter and a receiver. A transmit signal path (Tx path) of the radio frequency (RF) front end 200 includes a PA (power amplifier) 201 for amplifying input radio frequency (RF) signals. A receive signal path (Rx path) of the radio frequency (RF) front end 200 includes an LNA (low-noise amplifier) 202 to amplify received radio frequency (RF) signals and provides the amplified received radio frequency (RF) signals as an output. One or more filters may be included to generate suitable radio frequency (RF) signals for transmission and reception. In addition, the radio frequency (RF) front end 200 may include other components or circuits 203, such as, for example, a tuner or a matching network, switches, multiplexers, and/or other circuits for coupling the radio frequency (RF) front end 200 to an antenna. In addition, other components may be included to support both transmit and receive functions.

Figure 3:
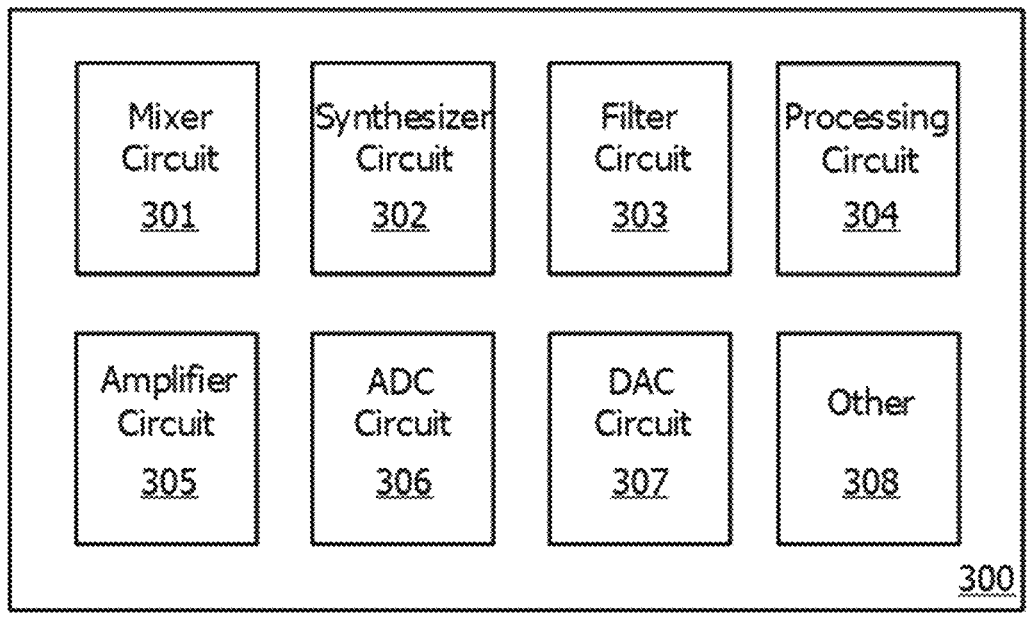
FIG. 3 shows schematically an example of a radio communication circuit.

FIG. 3 shows schematically an example of a radio communication circuit 300 which a radio communication device may include. The radio communication circuit 300 can include components such as a mixer circuit 301, a synthesizer circuit 302 (e.g., local oscillator), a filter circuit 303 (e.g., baseband filter), a processing circuit 304, an amplifier circuit 305, an analog-to-digital converter (ADC) circuit 306, a digital-to-analog (DAC) circuit 307, and other suitable digital front end (DFE) components 308, to name a few. The processing circuit 304 may include a processor, which may include a time-domain and/or frequency domain processor(s)/components in at least one example.

Accordingly, the exemplary radio frequency (RF) front end 200 referred with respect to FIG. 2 may be provided by a combination of the circuits provided with respect to the schematic representation of the example of the radio communication circuit 300. It should be noted that any of these circuits may include a plurality of circuits configured to provide the functionality. For example, the amplifier circuit 305 may include a plurality of amplifier circuits or amplifiers related to functions for various aspects of this disclosure.

The other components 308 may include logic components, modulation/demodulation elements, and an interface circuit for interfacing with another component, e.g., an SoC, or a modem. Digital front end components may include any suitable number and/or type of components configured to perform functions known to be associated with digital front ends.

The digital front end may include digital processing circuit, portions of processing circuitry, one or more portions of an on-board chip having dedicated digital front end functionality (e.g., a digital signal processor), etc. The digital front end components may selectively perform specific functions based upon the operating mode of the radio communication circuit 300. The digital front end components may facilitate beamforming.

Digital front end components may also include other components associated with data transmission such as, for instance, transmitter impairment correction such as LO correction, DC offset correction, IQ imbalance correction, and ADC skew, digital pre-distortion (DPD) calculation, correction factor (CF) calculation, and pre-emphasis (pre. emp.) calculation. To provide additional examples, the digital front end components may facilitate or perform receiver or transmitter digital gain control (DGC), up-sampling, down-sampling, zero crossing detection algorithms, phase modulation, perform beam management, digital blocker cancellation, received signal strength indicator (RSSI) measurements, DPD and calibration accelerators, test signal generation, etc.

The radio communication circuit 300 may include a receive signal path which may include the mixer circuit 301, the amplifier circuit 305, and the filter circuit 303. In some aspects, the transmit signal path of the radio communication circuit 300 may include the filter circuit 303, the amplifier circuit 305, and the mixer circuit 301. The radio communication circuit may also include the synthesizer circuit 302 to synthesize a frequency signal for use by the mixer circuit 301 of the receive signal path and the transmit signal path. The mixer circuit 301 of the receive signal path may be configured to down-convert radio frequency (RF) signals received based on the synthesized frequency provided by synthesizer circuit 302.

In some aspects, the output baseband signals and the input baseband signals may be digital baseband signals. In such aspects, the radio communication circuit 300 may include the analog-to-digital converter (ADC) circuit 306 and the digital-to-analog converter (DAC) circuit 307.

The radio communication circuit 300 may also include a transmit signal path (Tx path) which may include a circuit to up-convert baseband signals provided by a modem and provide radio frequency (RF) output signals for transmission. In some aspects, the receive signal path of the radio communication circuit 300 may include the mixer circuit 301, the amplifier circuit 305, and the filter circuit 303. In some aspects, the transmit signal path of the radio communication circuit 300 may include the filter circuit 303, the amplifier circuit 305, and the mixer circuit 301. The radio communication circuit 300 may include synthesizer circuit 302 to synthesize a frequency signal for use by the mixer circuit 301 of the receive signal path and the transmit signal path. The mixer circuit 301 of the receive signal path may be configured to received down-convert radio frequency (RF) signals based on the synthesized frequency provided by synthesizer circuit 302.

Amplifier circuit 305 may be configured to amplify the down-converted signals, and filter circuit 303 may be a low-pass filter (LPF) or band-pass filter (BPF) configured to remove unwanted signals from the down-converted signals to generate output baseband signals. Output baseband signals may be provided to another component, e.g., a modem, for further processing. In some aspects, the output baseband signals may be zero-frequency baseband signals, although this is not a requirement.

The mixer circuit 301 for a receive signal path may include passive mixers, although the scope of this disclosure is not limited in this respect. In some aspects, the mixer circuit 301 for a transmit signal path may be configured to up-convert input baseband signals based on the synthesized frequency provided by the synthesizer circuit 302 to generate radio frequency (RF) output signals. In various aspects, amplifier circuit 305 may be configured to amplify the radio frequency (RF) output signals, and filter circuit 303 may be a low-pass filter (LPF) or band-pass filter (BPF) configured to remove unwanted signals from the up-converted signals to provide communication signals to be transmitted. The radio frequency (RF) communication signals may be provided to another component, to an antenna port or an antenna.

In some aspects, the mixer circuit 301 of the receive signal path and the mixer circuit 301 of the transmit signal path may include two or more mixers and may be arranged for quadrature down conversion and up conversion, respectively. In some aspects, the mixer circuit 301 of the receive signal path and the mixer circuit 301 of the transmit signal path may include two or more mixers and may be arranged for image rejection (e.g., Hartley image rejection). In some aspects, the mixer circuit 301 of the receive signal path and the mixer circuit 301 may be arranged for direct down conversion and direct up conversion, respectively. In some aspects, the mixer circuit 301 of the receive signal path and the mixer circuit 301 of the transmit signal path may be configured for super-heterodyne operation.

In some dual-mode aspects, a separate radio IC circuit may be provided for processing signals for each spectrum, although the scope of this disclosure is not limited in this respect.

In some aspects, the synthesizer circuit 302 may be a fractional-N synthesizer or a fractional N/N+1 synthesizer, although the scope of the aspects is not limited in this respect as other types of frequency synthesizers may be suitable. For example, synthesizer circuit 302 may be a delta-sigma synthesizer, a frequency multiplier, or a synthesizer including a phase-locked loop with a frequency divider.

The synthesizer circuit 302 may be configured to synthesize an output frequency for use by the mixer circuit 301 of the radio communication circuit 300 based on a frequency input and a divider control input. The synthesizer circuit 302 may be a fractional N/N+1 synthesizer.

Frequency input may be provided by a voltage-controlled oscillator (VCO), although that is not a requirement. Divider control input may be provided by a processing component of the radio communication circuit 300 or may be provided by any suitable component, such as an external component like a modem. For example, the modem may provide a divider control input depending on the desired output frequency. A divider control input (e.g., N) may be determined from a look-up table based on a channel indicated by an external component.

Synthesizer circuit 302 of the radio communication circuit 300 may include a divider, a delay-locked loop (DLL), a multiplexer, and a phase accumulator. The divider may be a dual modulus divider (DMD) and the phase accumulator may be a digital phase accumulator (DPA). The DMD may be configured to divide the input signal by either N or N+1 (e.g., based on a carry out) to provide a fractional division ratio. The DLL may include a set of cascaded, tunable, delay elements, a phase detector, a charge pump, and a D-type flip-flop. The delay elements may be configured to break a VCO period up into No equal packets of phase, where Nd is the number of delay elements in the delay line. In this way, the DLL provides negative feedback to help ensure that the total delay through the delay line is one VCO cycle.

Synthesizer circuit 302 may be configured to generate a carrier frequency as the output frequency, while in an alternative, the output frequency may be a multiple of the carrier frequency (e.g., twice the carrier frequency, four times the carrier frequency) and used in conjunction with quadrature generator and divider circuit to generate multiple signals at the carrier frequency with multiple different phases with respect to each other. The output frequency may be a LO frequency (fLO). In some aspects, the radio communication circuit 300 may include an IQ/polar converter.

While the radio communication circuit 300 described herein include traditional super-heterodyning schemes or architectures, other types of transceiver or transmitter architectures and schemes may be used. The radio communication circuit 300 may include components to implement a near zero IF scheme, a Direct Conversion scheme, or a digital transmission scheme, such as, for example, a Digital IQ transmission, a Digital Polar transmission, and the like.

The radio communication circuit 300 may include a transmit path that includes or implements a direct digital transmitter (DDT). That is, a DDT may include a digital signal processor, an RF digital-to-analog converter (RF-DAC), an RF filter/antenna coupler. Further, a DDT may be implemented with or without an IQ-mixer. In general, an RF-DAC may be included on an RFIC to convert digital input into an RF signal. A DDT may include other digital components such as numerically controlled oscillator (NCO) and digital mixers for shifting an input signal to the desired frequency.

The use of a DDT can reduce the number of analog components needed in the transmitter or transmit path. For example, analog LOs, analog filters, analog mixers, and etc., may be eliminated from the RFIC when a direct digital transmitter such as DDT is employed. Further, the use of a digital transmitter or digital transmission schemes may bring energy savings and efficiencies.

Figure 4:
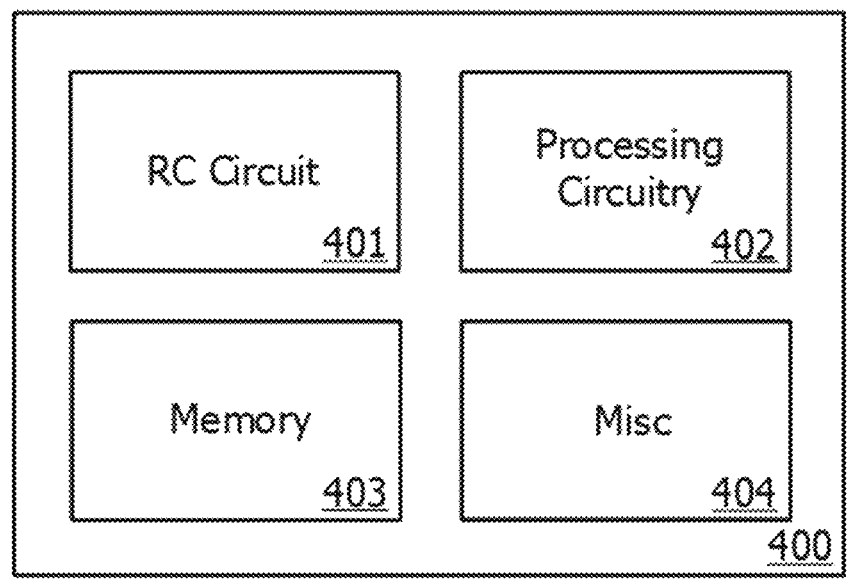
FIG. 4 shows schematically a block diagram of an exemplary radio communication device or system in accordance with various aspects of the disclosure.

FIG. 4 illustrates schematically a block diagram of an exemplary radio communication device 400 or system. The components of the radio communication device 400 are provided for ease of explanation, and in other cases, the radio communication device 400 can include additional, less, or alternative components as those shown in FIG. 4.

As shown in FIG. 4, the radio communication device 400 can include a radio communication circuit 401, exemplarily the radio communication circuit provided with respect to FIG. 3, a processing circuit 402, a memory 403. The radio communication device 400 may include miscellaneous components, modules, or portions 404 as well. The radio communication device 400 may include a modem or SoC. The radio communication device 400 may include one or more power sources, display interfaces, peripheral devices, ports (e.g., input, output), etc.

The radio communication device 400 may be used for products involving 5G, Wifi, BT, UWB, or any suitable wireless network products. The radio communication device 400 may also be used for any device supporting data-intensive applications, including streaming video (e.g., 4K, 8K video) or augmented/virtual reality (AR/VR) devices. The radio communication device 400 may also be used for vehicles, e.g., to help support a self-driving car and/or to be used as vehicle network. The radio communication device 400 may be used for Vehicle-to-everything (V2X) which includes vehicle-to-vehicle (V2V) and vehicle-to-infrastructure (V2I).

The processing circuit 402 may include any suitable number and/or type of computer processors, such as, for facilitating control of the radio communication device 400. In some cases, the processing circuit 402 may include a baseband processor (or suitable portions thereof) implemented by the radio communication device. In other cases, the processing circuit 402 may be one or more processors that are separate from the baseband processor (e.g., one or more digital signal processors). The processing circuit 402 may be working together with a processing circuit of the radio communication circuit 401. The processing circuit 402 may include a processing circuit of the radio communication circuit 401. Additionally, or alternatively, other examples may include various functions discussed herein by the processing circuit 402.

The processing circuit 402 may be configured to carry out instructions to perform arithmetical, logical, and/or input/output (I/O) operations, and/or to control the operation of one or more components of the radio communication device 400. For example, the processing circuit 402 can include one or more microprocessors, memory registers, buffers, clocks, etc. Moreover, aspects include processing circuit 402 communicating with and/or controlling functions associated with the memory 403 and/or functions of the radio.

The memory 403 may store data and/or instructions such that, when the instructions are executed by the processing circuit 402, the processing circuit 402 performs the various functions described herein. The memory 403 may be implemented as a non-transitory computer-readable medium storing one or more executable instructions such as, for example, logic, algorithms, code, etc. Instructions, logic, code, etc., stored in the memory 403 may enable the aspects disclosed herein to be functionally realized.

Figure 5:
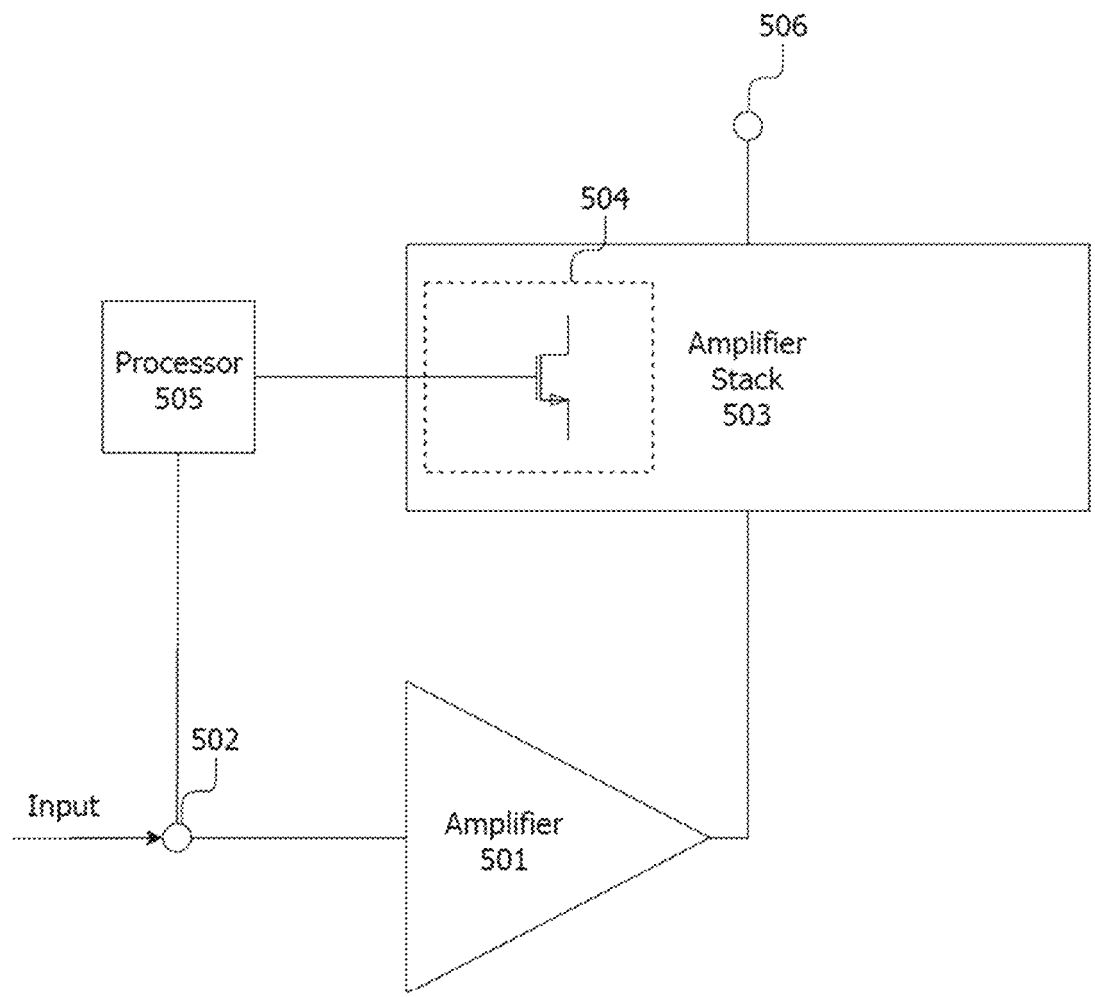
FIG. 5 shows schematically an example of an amplifier circuit in accordance with various aspects of this disclosure.

FIG. 5 shows schematically an example of an amplifier circuit. The amplifier circuit includes an amplifier 501. The amplifier 501 is coupled to an input terminal 502 to receive an input signal. The amplifier 501 receives the input signal from the input terminal 502 and amplifies the input signal. The amplifier 501 provides an output signal from its output.

The amplifier 501 may include an amplifier stage. The amplifier 501 may include one or more transistors configured to amplify the input signal. The amplifier 501 may be a transconductance amplifier in a differential configuration configured to receive the input signal as input voltage in differential pairs and produces an output current for the output signal. The input signal may include a radio frequency (RF) signal.

The amplifier 501 may be coupled to an amplifier stack 503. The amplifier stack 503 may include at least one first transistor 504 configured to amplify the output signal which the amplifier 501 provides. The first transistor 504 may be coupled to a transistor of the amplifier 501 in a cascode configuration. The amplifier stack 503 may have a second input terminal to receive an input control signal to control the first transistor 504 based on an envelope of the input signal. The first transistor 504 may be configured to receive the input control signal by its gate terminal, so that the characteristics of the first transistor 504 (e.g. the conductivity of the first transistor 504, amplification provided by the first transistor 504) change based on the input control signal.

The amplifier circuit may include a processor 505, or coupled to a processor of a radio communication circuit. When the amplifier circuit is coupled to the processor of the radio communication circuit, the processor of the radio communication circuit may perform similar aspects with the processor 505. The processor 505 may provide the input control signal to the amplifier stack 503. The processor 505 may receive the input signal from the input terminal 502, and the processor 505 may provide the input control signal which is based on the envelope of the input signal to the amplifier stack 503.

The processor 505 may be configured to detect an envelope signal of a received signal. The processor 505 may include an envelope detector configured to detect an envelope signal of a received signal. The envelope may include any type of envelope detecting methods or circuits used to detect the envelope of the received signal. For example, the envelope detector may include a diode detector including at least one diode and at least one resistor coupled in parallel from an output of the envelope detector. The envelope detector may include a precision rectifier including an operational amplifier. The envelope detector may include a specific semiconductor adapted to detect the envelope of the received signal. Accordingly, the processor 505 detects the envelope signal of the received signal which is the input signal.

The processor 505 may further adjust the amplitude and/or phase of the envelope signal. The processor 505 may adjust the amplitude and/or phase of the envelope signal to align the envelope signal to an envelope of the signal flowing through the source and drain terminals of the first transistor 504. The processor 505 may adjust the amplitude and/or phase of the envelope signal so that the gate-source and gate-drain cross voltages in terms of the envelope of these signals become flatter. The processor 505 may adjust the amplitude and/or phase of the envelope signal to increase the correlation between the envelope of the signal between the gate-source terminals and the gate-drain terminals of the first transistor 504.

The processor 505 may adjust the amplitude and/or phase of the envelope signal in order to keep the gain of the amplifier stack 503, or the first transistor 504, constant. The processor 505 may adjust the amplitude and/or phase of the envelope signal in order to keep the gain of the amplifier stack 503, or the first transistor 504, linear. The processor 505 may adjust the amplitude and/or phase of the envelope signal in order to keep the ratio of the capacitance of the gate-source terminals and the capacitance of the drain-source terminals of the first transistor 504 constant. The processor 505 may adjust the amplitude and/or phase of the envelope signal in order to keep the ratio of the capacitance of the gate-source terminals and the capacitance of the drain-source terminals of the first transistor 504 linear. The processor 505 may adjust the amplitude and/or phase of the envelope signal to reduce memory effects.

The processor 505 may adjust the amplitude and/or phase of the envelope signal in order to keep the cross voltage between the gate terminal and the source terminal of the first transistor 504 substantially constant. The processor 505 may adjust the amplitude and/or phase of the envelope signal in order to reduce the cross voltage between the gate terminal and the drain terminal of the first transistor 504.

The processor 505 may adjust the amplitude and/or phase of the envelope signal by adjusting the amplitude and/or phase of the received signal (e.g. the input signal). The processor 505 may adjust the amplitude and/or phase of the envelope signal by adjusting the amplitude and/or phase of the envelope signal which is detected by the processor 505. The processor 505 may include any type of amplitude and/or phase adjusting methods, functions, or circuits. Exemplarily, the processor 505 may include an operational amplifier, an amplifier circuit, a delay circuit, and the processor 505 is configured to adjust the amplitude and/or phase of the envelope signal in accordance with one or more predetermined parameters.

The processor 505 may receive a feedback signal from the amplifier 501, and/or from the amplifier stack 503 to adjust the amplitude and/or phase of the envelope signal based on the feedback signal. The processor 505 may be configured to adjust the amplitude and/or phase of the envelope signal based on a bias voltage of the amplifier stack 503, or the first transistor 504. The processor 505 may receive a feedback signal from an output of the amplifier circuit to adjust the amplitude and/or phase of the envelope signal based on the feedback signal.

Exemplarily, the feedback signal may include an indication of the cross voltage between the gate terminal and the source terminal of the first transistor 504 to be used to keep the cross voltage between the gate terminal and the source terminal of the first transistor 504 substantially constant, and/or to reduce the cross voltage between the gate terminal and the drain terminal of the first transistor 504. The feedback signal may include an indication of the gain of the amplifier stack, and/or an indication for the ratio of the capacitance of the gate-source terminals and/or the capacitance of the drain-source terminals of the first transistor 504.

Accordingly, the processor 505 may provide the input control signal after adjusting the amplitude and/or phase of the envelope signal based on the received signal, which is in this example the input signal. The input control signal may include the envelope of the input signal with an adjusted amplitude and/or phase. Alternatively, the processor 505 may receive the output signal of the amplifier 501 and may adjust the amplitude and/or phase of the output signal of the amplifier 501 and provides the input control signal including the envelope of the output signal of the amplifier 501 with an adjusted amplitude and/or phase. The processor 505 may receive an output signal of the amplifier circuit and may adjust the amplitude and/or phase of the output signal of the amplifier circuit and provides the input control signal including the envelope of the output signal of the amplifier circuit with an adjusted amplitude and/or phase.

A low pass filter may be coupled to the processor 505, and the processor 505 provides the input control signal to the low pass filter. Accordingly, the low pass filter may filter out the noise and spurs which would fall to the filtered portion of the frequency band.

The amplifier circuit may include a plurality of amplifier stacks that are equal to the amplifier stack 503 and which are coupled to the amplifier stack 503, exemplarily including transistors that are coupled to the first transistor 504 in a cascode configuration. At least one of the plurality of amplifier stacks may be coupled to the processor 505 to receive an input control signal to control transistors of the respective amplifier stacks in a manner similar to the control provided for the amplifier stack 503.

Accordingly, the amplifier stack 503 may amplify the output signal in accordance with received the input control signal and provides an amplifier circuit output signal based on the input signal received by the amplifier 501 and the received input control signal from an amplifier circuit output 506.

Figure 6:
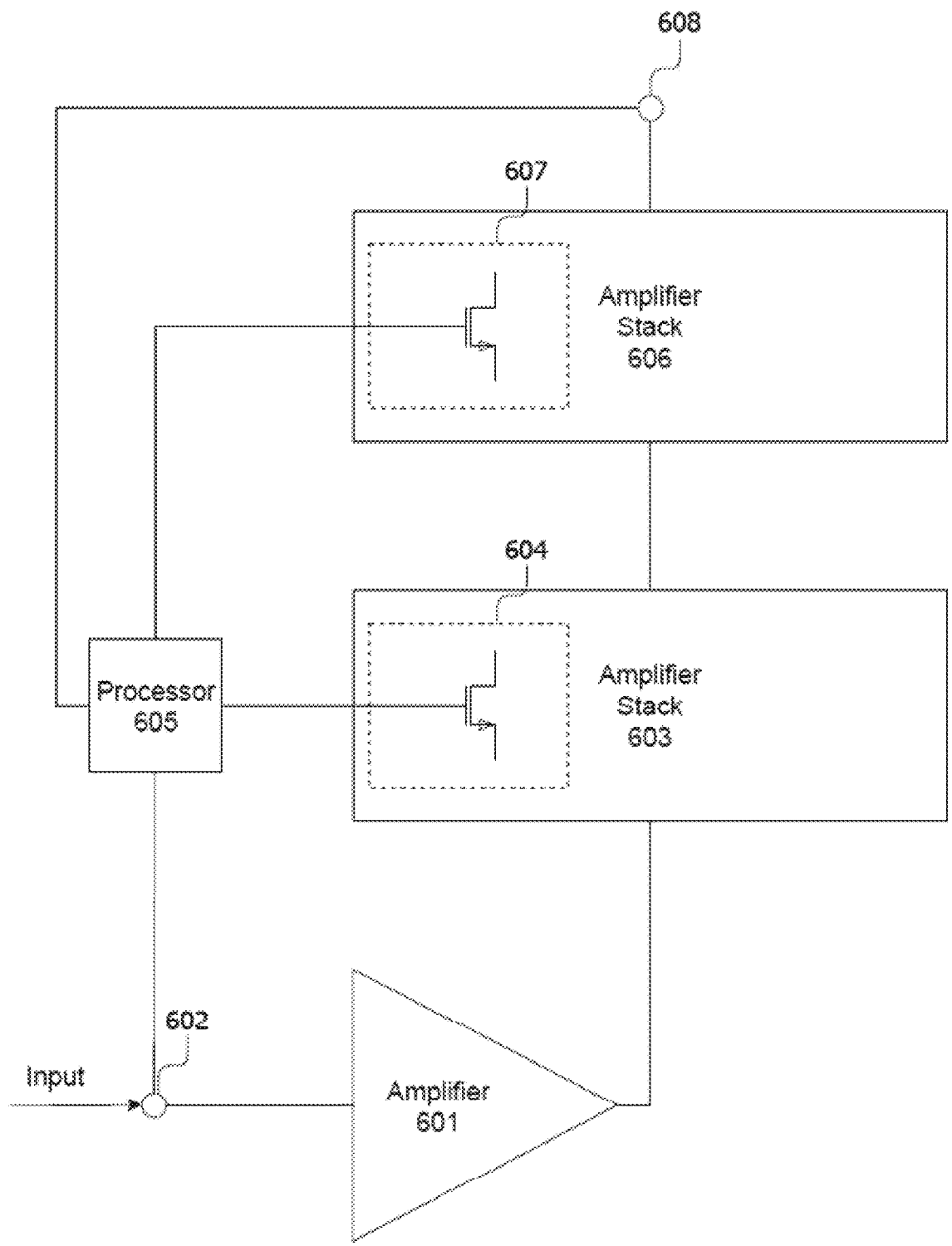
FIG. 6 shows schematically an example of an amplifier circuit in accordance with various aspects of this disclosure.

FIG. 6 shows schematically an example of an amplifier circuit. The amplifier circuit includes an amplifier 601 coupled to an input terminal 602 to receive an input signal, and the amplifier 601 provides an amplified output as an output signal to a first amplifier stack 603. The first amplifier stack 603 may include at least a first transistor 604, and the first amplifier stack 603 may be coupled to a processor 605. The processor 605 may be configured to provide a first input control signal to the first amplifier stack 603 to control the first transistor 604. Various aspects that are provided in accordance with FIG. 5 in this disclosure may also apply to FIG. 6, e.g. in relation to the amplifier 601, the input element 602, the first amplifier stack 603, the first transistor 604, and the processor 605.

The amplifier circuit may alternatively be coupled to a processor of a radio communication circuit. When the amplifier circuit is coupled to the processor of the radio communication circuit, the processor of the radio communication circuit may perform similar aspects with the processor 605. In other words, the processor of the radio communication circuit may include the processor 605.

The amplifier circuit may include a plurality of amplifier stacks. The first amplifier stack 603 may be coupled to a second amplifier stack 606, and the first amplifier stack 603 is configured to provide a first amplifier stack output signal to the second amplifier stack 606. The second amplifier stack 606 may include at least a first transistor 607 configured to amplify the first amplifier stack output signal which the first amplifier stack 603 provides. The first transistor 607 of the second amplifier stack 606 may be coupled to the first transistor 604 of the first amplifier stack 603 in a cascode configuration.

The second amplifier stack 606 may have a second input terminal to receive a second input control signal to control the first transistor 607 of the second amplifier stack 606. The first transistor 607 of the second amplifier stack 606 may be configured to receive the second input control signal by its gate terminal so that the characteristics of the first transistor 607 of the second amplifier stack 606 (e.g. the conductivity, amplification) change based on the second input control signal. Accordingly, the second amplifier stack 606 may provide its output to a second amplifier stack output terminal 608. The second amplifier stack output terminal 608 may be an amplifier circuit output terminal.

The first transistor 607 of the second amplifier stack 606 may receive the second input control signal from the processor 605. The processor 605 may provide the second input control signal including the same signal as the first input control signal. Accordingly, the processor 605 may provide the same input control signal for each of the plurality of amplifier stacks, including the first amplifier stack 603 and the second amplifier stack 606.

The processor 605 may provide a second input control signal to the second amplifier stack 606 which is different than a first input control signal which the processor 605 provides to the first amplifier stack 603.

The processor 605 may adjust the amplitude and/or phase of an envelope signal of the received signal differently. The processor 605 may adjust the amplitude and/or phase of the envelope signal to obtain the first input control signal in order to align the envelope signal to an envelope of the signal flowing through the source and drain terminals of the first transistor 604 of the first amplifier stack 603. Similarly, the processor 605 may adjust the amplitude and/or phase of the envelope signal to obtain the second input control signal in order to align the envelope signal to an envelope of the signal flowing through the source and drain terminals of the first transistor 607 of the second amplifier stack 606.

The processor 605 may adjust the amplitude and/or phase of the envelope signal to provide the first input control signal so that the gate-source and gate-drain cross voltages of the first transistor 604 of the first amplifier stack 603 in terms of envelopes of these signals become flatter, and similarly, the processor 605 may adjust the amplitude and/or phase of the envelope signal to provide the second input control signal so that the gate-source and gate-drain cross voltages of the first transistor 607 of the second amplifier stack 606 in terms of envelopes of these signals become flatter.

With respect to FIG. 5, the processor 605 may adjust the amplitude and/or phase of the envelope signal to provide the first input control signal and the second input control signal (and further input control signals for other amplifier stacks) for the transistors of each stack of the plurality of stacks, in order to increase the correlation between the envelope of the signal between the gate-source terminals and the gate-drain terminals of the respective transistors, and/or in order to keep the gain of the respective stack amplifier linear or constant, and/or in order to keep the ratio of the capacitance of the gate-source terminals and the capacitance of the drain-source terminals of the respective transistor linear or constant, and/or in order to reduce the memory effects for the respective amplifier stack.

The processor 605 may adjust the amplitude and/or phase of the envelope signal in order to keep the cross voltage between the gate terminal and source terminal of the transistors in an amplifier stack substantially constant. The processor 605 may adjust the amplitude and/or phase of the envelope signal in order to reduce the cross voltage between the gate terminal and drain terminal of the transistors of an amplifier stack.

The processor 605 may receive the input signal from the input terminal 602, and the processor 605 may adjust the amplitude and/or phase of the envelope signal of the input signal to obtain the first input control signal. The first input control signal may include the envelope signal of the input signal adjusted in amplitude and/or phase.

The processor 605 may also receive an output signal of the second amplifier stack 606 (which may be also an amplifier circuit output signal) from the second amplifier stack output terminal 608, and the processor 605 may adjust the amplitude and/or phase of the envelope signal of the output signal of the second amplifier stack 606, which may include an amplified output signal of the input signal by the amplifier 601, the first amplifier stack 603, and the second amplifier stack 606. The second input control signal may include the envelope signal of the output signal of the second amplifier stack 606, or the output signal of the amplifier circuit adjusted in amplitude and/or phase.

The processor 605 may receive an output signal of the first amplifier stack 603 from a first amplifier stack output terminal (not shown), and the processor 605 may adjust the amplitude and/or phase of the envelope signal of the output signal of the first amplifier stack 603, which may include an amplified output signal of the input signal by the amplifier 601, and the first amplifier stack 603. The second input control signal may include the envelope signal of the output signal of the first amplifiers stack 603 adjusted in amplitude and/or phase.

The processor 605 may adjust the amplitude and/or phase of the envelope signal by adjusting the amplitude and/or phase of the received signal (e.g. the input signal, the output signal of the first amplifier stack 603, the output signal of the second amplifier stack 606, the output signal of the amplifier circuit). The processor 605 may adjust the amplitude and/or phase of the envelope signal by adjusting the amplitude and/or phase of the envelope signal which is detected by the processor 605. The processor 605 may include any type of amplitude and/or phase adjusting methods, functions, or circuits.

The processor 605 may include an operational amplifier, an amplifier circuit, a delay circuit, and the processor 605 is configured to adjust the amplitude and/or phase of the envelope signal in accordance with one or more predetermined parameter. The processor 605 may receive a feedback signal from the amplifier 601, and/or from the first amplifier stack 603, and/or from the second amplifier stack 606 to adjust the amplitude and/or phase of the envelope signal based on the feedback signal. The processor 605 may be configured to adjust the amplitude and/or phase of the envelope signal based on a bias voltage of the first amplifier stack 603, or the first transistor 604. The processor 605 may receive a feedback signal from an output of the amplifier circuit to adjust the amplitude and/or phase of the envelope signal based on the feedback signal.

Exemplarily, the feedback signal may include an indication of the cross voltage between the gate terminal and the source terminal of the first transistor 604 to be used to keep the cross voltage between the gate terminal and the source terminal of the first transistor 604 substantially constant, and/or to reduce the cross voltage between the gate terminal and the drain terminal of the first transistor 604. The feedback signal may include an indication of the gain of an amplifier stack, and/or an indication for the ratio of the capacitance of the gate-source terminals and/or the capacitance of the drain-source terminals of the first transistor 604.

A low pass filter may be coupled to the processor 605, and the processor 605 provides input control signals to the low pass filter. Accordingly, the low pass filter may filter out the noise and spurs which would fall to the filtered portion of the frequency band. The processor 605 may provide each of the input control signals to separate respective low pass filters for each of the input control signals.

Figure 7:
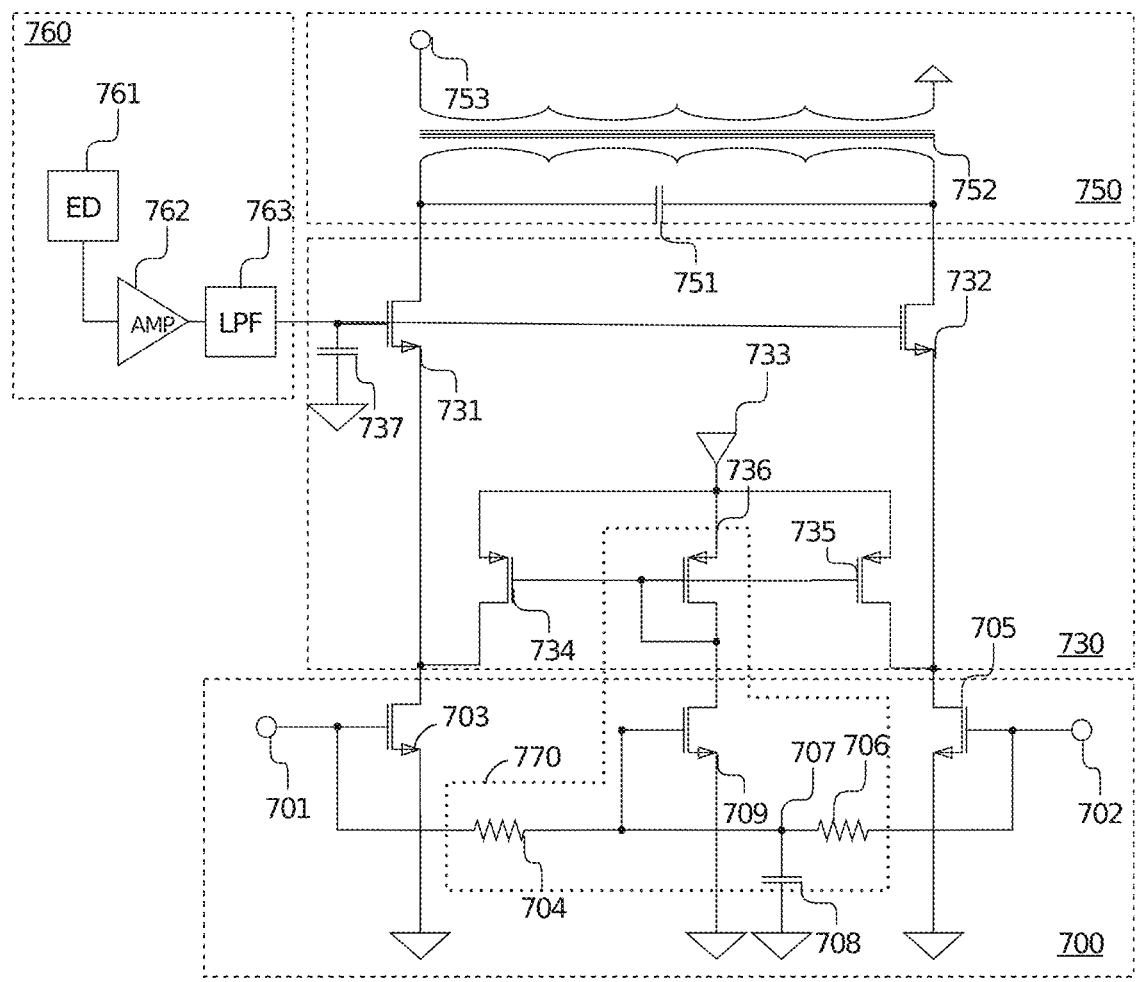
FIG. 7 shows schematically an example of an amplifier circuit in accordance with various aspects of this disclosure.

FIG. 7 shows schematically an example of an amplifier circuit in accordance with various aspects of this disclosure. The amplifier circuit may include an amplifier 700, an amplifier stack 730, a matching block 750, and a processor 760. Aspects which are provided in this disclosure, for example, the aspects in accordance with FIG. 5, and FIG. 6 may also apply to FIG. 7, e.g. in relation to the amplifier 700, the amplifier stack 730, and the processor 760. The amplifier circuit may alternatively be coupled to a processor of a radio communication circuit. When the amplifier circuit is coupled to the processor of the radio communication circuit, the processor of the radio communication circuit may perform similar aspects with the processor 760. In other words, the processor of the radio communication circuit may include the processor 760.

The amplifier 700 may include a transconductance amplifier in a differential configuration. The amplifier 700 may include two input terminals, a first input terminal 701 and a second input terminal 702 which are configured to receive a radio frequency (RF) input signal in differential pairs. The first input terminal may be coupled to a gate terminal of a first transistor 703. The second input terminal may be coupled to a gate terminal of a second transistor 705. Each of the first transistor 704 and the second transistor 705 may include an N-type metal-oxide semiconductor (NMOS).

The first input terminal may be coupled to a first resistor 704 in parallel. The second input terminal may be coupled to a second resistor 706 in parallel. A third transistor 709 may be also coupled to the coupling node from a gate terminal, and the first resistor and the second resistor may be coupled to each other at a coupling node 707. A capacitor 708 which is coupled to the ground may also be coupled to the coupling node 707. The third transistor 709 may be used to arrange the supply voltage of a current source of the amplifier stack 730 in combination with the first and second resistors 704, 706, and the capacitor 708. The third transistor 709 may include an N-type metal-oxide-semiconductor (NMOS).

The amplifier stack 730 may include a first transistor 731 and a second transistor 732 arranged in a differential configuration. The first transistor 731 of the amplifier stack 730 and the second transistor 732 of the amplifier stack 730 may be coupled to the amplifier 700 to receive an output signal of the amplifier 700. The first transistor 731 of the amplifier stack 730 may be coupled to the first transistor 703 of the amplifier 700. The source terminal of the first transistor 731 of the amplifier stack 730 may be coupled to the drain terminal of the first transistor 703 of the amplifier 700. The second transistor 732 of the amplifier stack 730 may be coupled to the second transistor 705 of the amplifier 700. The source terminal of the second transistor 732 of the amplifier stack 730 may be coupled to the drain terminal of the second transistor 705 of the amplifier 700. Each of the first transistor 731 of the amplifier stack 730 and the second transistor 732 of the amplifier stack 730 may include N type metal-oxide-semiconductor (NMOS).

The amplifier stack 730 may include a current source to provide input current from an electrical supply 733. The current source may be coupled to the electrical supply 733 to receive the electrical supply which may be provided as a supply voltage. The current source may include a first current source transistor 734, and a second current source transistor 735. A drain terminal of the first current source transistor 734 may be coupled to the source terminal of the first transistor 731 of the amplifier stack 730, and a drain terminal of the second current source transistor 735 may be coupled to the source terminal of the second transistor 732 of the amplifier stack 730. Each of the first current source transistor 734 the second current source transistor 735 may include P-type metal-oxide-semiconductor (PMOS).

In an example, a third transistor 736 may be coupled to the electrical supply 733 from its source terminal, and the drain terminal of the third transistor 736 may be coupled to the third transistor 709 which is coupled to the amplifier 700 which may be used to arrange supply voltage of the current source of the amplifier stack 730 in combination with the first and second resistors 704, 706, and the capacitor 708 coupled the amplifier 700. The third transistor 736 coupled to the amplifier stack 730 may include P-type metal-oxide-semiconductor (PMOS). The drain terminal of the third transistor 736 that is coupled to the amplifier stack 730 may be coupled to a gate terminal of the third transistor 736 coupled to the amplifier stack 730, which the gate terminal is coupled to a gate terminal of the first transistor 731 of the amplifier stack 730, and a gate terminal of the second transistor 732 of the amplifier stack 730.

Accordingly, a partial shunt circuit 770 which may include the combination of the third transistor 709 coupled to the amplifier 700, the third transistor 736 coupled to the amplifier stack 730, the first and second resistors 704, 706, and the capacitor 708 may be configured to limit a direct current (DC) flowing from the amplifier 700 to the amplifier stack 730 by dividing the direct current (DC) voltage provided to the first transistor 731 and the second transistor 732 of the amplifier stack 730 by the electrical supply 733.

The amplifier circuit may include one amplifier stack, the amplifier stack 730. The output of the amplifier stack 730 may be coupled to the matching block 750 to match the impedance. Accordingly, a drain terminal of the first transistor 731 of the amplifier stack 730, and a drain terminal of the second transistor 732 of the amplifier stack 730 may provide an output of the amplifier stack 730. The drain terminal of the first transistor 731 of the amplifier stack 730, and the drain terminal of the second transistor 732 of the amplifier stack 730 may be coupled to a decoupling capacitor 751, and a transformer 752. Accordingly, the amplifier circuit provides an amplifier circuit output signal from an amplifier circuit output 753.

The amplifier stack 730 may include a decoupling capacitor 737 coupled to an input to receive an input control signal to control the first transistor 731 and the second transistor 732. Alternatively, the radio communication circuit may provide a decoupling capacitor which may be equivalent to the decoupling capacitor 737 to filter out the direct current (DC) component of the input control signal.

The amplifier circuit may include a processor 760. Alternatively, the amplifier circuit may be coupled to a processor of a radio communication circuit. When the amplifier circuit is coupled to the processor of the radio communication circuit, the processor of the radio communication circuit may perform similar aspects with the processor 760. The processor 760 may provide the input control signal to the amplifier stack 730.

The processor 760 may receive the input signal which may include the radio frequency (RF) input signal, and the processor 760 provides the input control signal which is based on the envelope of the input signal to the amplifier stack 730. In another example, the processor 760 may receive an input signal which may include the amplifier circuit output signal (which may also be the output signal of the amplifier stack 730) received from the amplifier circuit output 753 and the processor 760 may provide the input control signal which is based on the envelope of the amplifier circuit output signal to the amplifier stack 730, which the amplifier circuit output signal may include an amplified version of the radio frequency (RF) input signal. The processor 760 may receive at least two of the radio frequency (RF) input signal and/or the output signal of the amplifier stack 730 an/or the amplifier circuit output signal to provide the input control signal.

Various aspects that are provided in accordance with FIG. 5 and FIG. 6 in this disclosure may also apply to FIG. 7, especially for the processor 760 regarding processors provided in accordance with FIG. 5 and FIG. 6. The processor 760 is configured to detect an envelope signal of a received signal. The processor 760 may include an envelope detector 761 configured to detect an envelope signal of a received signal.

The processor 760 may further adjust the amplitude and/or phase of the envelope signal. The processor 760 may adjust the amplitude and/or phase of the envelope signal in order to align the envelope signal to an envelope of the signal flowing through the source and drain terminals of the first transistor 731 and/or the second transistor 732 of the amplifier stack 730. The processor 760 may adjust the amplitude and/or phase of the envelope signal so that the gate-source and gate-drain cross voltages of the first transistor 731 and/or the second transistor 732 of the amplifier stack 730 in terms of envelopes of these signals become flatter. The processor 760 may adjust the amplitude and/or phase of the envelope signal to increase the correlation between the envelope of the signal between the gate-source terminals and the gate-drain terminals of the first transistor 731 and/or the second transistor 732 of the amplifier stack 730.

The processor 760 may adjust the amplitude and/or phase of the envelope signal to provide the first input control signal and the second input control signal (and further input control signals for other amplifier stacks) for amplifying transistors of each stack of the plurality of stacks, in order to increase the correlation between the envelope of the signal between the gate-source terminals and the gate-drain terminals of the respective transistors, and/or in order to keep the gain of the respective stack amplifier linear or constant, and/or in order to keep the ratio of the capacitance of the gate-source terminals and the capacitance of the drain-source terminals of the respective transistor linear or constant, and/or in order to reduce the memory effects for the respective amplifier stack.

The processor 760 may adjust the amplitude and/or phase of the envelope signal in order to keep the cross voltage between the gate terminal and source terminal of at least one of the transistors of the plurality of amplifier stacks substantially constant. The processor 760 may adjust the amplitude and/or phase of the envelope signal in order to reduce the cross voltage between the gate terminal and drain terminal of at least one of the transistors of the plurality of amplifier stacks substantially constant.

The processor 760 may adjust the amplitude and/or phase of the envelope signal by adjusting the amplitude and/or phase of the received signal (e.g. the radio frequency (RF) input signal, the output signal of the amplifier stack 730, the output signal of the amplifier circuit). The processor 760 may adjust the amplitude and/or phase of the envelope signal by adjusting the amplitude and/or phase of the envelope signal which is detected by the processor 760. The processor 760 may include any type of amplitude and/or phase adjusting methods, functions, or circuits. The processor 760 may include an amplifier block 762 to adjust the amplitude and/or phase of the envelope signal.

The processor 760 can be implemented by using either a digital method or an analog method to detect the envelope signal from the input modulated RF signal and process the envelope signals with amplitude and phase adjustments. The processor 760 can also be implemented by either a digital method or an analog method with the envelope signal as input.

The amplifier block 762 may include an operational amplifier, an amplifier circuit, a delay circuit, and the processor 760 may be configured to adjust the amplitude and/or phase of the envelope signal in accordance with one or more predetermined parameters. The amplitude and/or phase of the envelope signal may be adjusted, so that the input control signal to be provided at the common gate terminals of the transistors of the amplifier stack 730 and the radio frequency (RF) signal is canceled out at the common gate terminals of the transistors of the amplifier stack.

The processor 760 may receive a feedback signal from the amplifier 700, and/or from the amplifier stack 730 to adjust the amplitude and/or phase of the envelope signal based on the feedback signal. The processor 760 may be configured to adjust the amplitude and/or phase of the received signal based on a bias voltage of the amplifier stack 730, or at least one bias voltage of the first transistor 731 and/or the second transistor 732 of the amplifier stack 730. The feedback signal may include an indication of a bias voltage of the amplifier stack 730, or at least one bias voltage of the first transistor 731 and/or the second transistor 732 of the amplifier stack 730. The processor 760 may receive a feedback signal from an output of the amplifier circuit to adjust the amplitude and/or phase of the envelope signal based on the feedback signal. The amplifier block 762 may be configured to provide a threshold for the input control signal based on the envelope signal.

The feedback signal may include an indication of the cross voltage between the gate terminal and the source terminal of the first transistor 731 and/or the second transistor 732 to be used to keep the cross voltage between the gate terminal and the source terminal of at least one of the first transistor 731 and/or the second transistor 732 substantially constant, and/or to reduce the cross voltage between the gate terminal and the drain terminal of the first transistor 731 and/or the second transistor 732. The feedback signal may include an indication of the gain of the amplifier stack, and/or an indication for the ratio of the capacitance of the gate-source terminals and/or the capacitance of the drain-source terminals of the first transistor 731 and/or the second transistor 732.

The processor 760 may be configured to receive at least two signals and perform different adjustments in amplitude and/or phase. The processor 760 may provide a first adjustment in amplitude and/or phase to the received signal, and provide a first input control signal to the first transistor 731 of the amplifier stack 730; and the processor 760 may provide a second adjustment in amplitude and/or phase to the received signal, and provide a second input control signal to the second transistor 732 of the amplifier stack 730.

The provided first adjustment in amplitude and/or phase may include changing at least one of amplitude or phase of the received signal with a first parameter, and the provided second adjustment in amplitude and/or phase may include changing at least one of amplitude or phase of the received signal with a second parameter. The first input control signal and the second control signal are different according to at least one of their amplitudes or phases.

The processor 760 may be configured to provide the first adjustment in amplitude and/or phase based on a first feedback signal, and the processor 760 may be configured to provide the second adjustment in amplitude and/or phase based on a second feedback signal. The processor 760 may be configured to provide the first adjustment in amplitude and/or phase and the second adjustment in amplitude and/or phase based on a predetermined plurality of parameters.

The processor 760 may receive a first received signal based on a first differential portion of the radio frequency (RF) input signal provided to the first transistor 703 of the amplifier 700, and a second received signal based on a second differential portion of the radio frequency (RF) input signal provided to the second transistor 705 of the amplifier 700. The processor 760 may receive a first received signal based on a first differential portion of the output signal of the amplifier stack 730, and a second received signal based on a second differential portion of the output signal of the amplifier stack 730. The processor 760 may be coupled to the drain terminal of the first transistor 731 of the amplifier stack to receive the first differential portion of the output signal of the amplifier stack 730. The processor 760 may be coupled to the drain terminal of the second transistor 732 of the amplifier stack 730 to receive the second differential portion of the output signal of the amplifier stack 730.

Accordingly, the processor 760 may adjust the amplitude and/or phase of the first received signal to obtain the first input control signal, and adjust the amplitude and/or phase of the second received signal to obtain the second input control signal. The processor 760 may provide the first adjustment in amplitude and/or phase to the first received signal to obtain the first input control signal, and the processor 760 may provide the second adjustment in amplitude and/or phase to the second received signal to obtain the second control signal.

The processor 760 may include a low pass filter 763, and the processor 760 may provide an unfiltered input control signal to the low pass filter. Accordingly, the low pass filter 763 may filter out the noise and spurs which would fall to the filtered portion of the frequency band, and provides the input control signal to the amplifier stack 730.

Accordingly, the processor 760 may provide the input control signal after adjusting the amplitude and/or phase of the envelope signal based on the received signal. The input control signal may include the envelope of the input signal with an adjusted amplitude and/or phase. Alternatively, the processor 760 may receive the output signal of the amplifier 700 and may adjust the amplitude and/or phase of the output signal of the amplifier 700 and may provide the input control signal including the envelope of the output signal of the amplifier 700 with an adjusted amplitude and/or phase. In another example, the processor 760 may receive the output signal of the amplifier circuit and may adjust the amplitude and/or phase of the output signal of the amplifier circuit and provides the input control signal including the envelope of the output signal of the amplifier circuit with an adjusted amplitude and/or phase.

The amplifier circuit may include a plurality of amplifier stacks which are equal to the amplifier stack 730 and which are coupled between the amplifier stack 730 and the matching block 750, exemplarily including transistors which are coupled to the first transistor 703 and second transistor 705 of the amplifier 700 in a cascade configuration respectively. At least one of the plurality of amplifier stacks may be coupled to the processor 760 to receive an input control signal to control transistors of the respective amplifier stacks in a manner similar to the control provided for the amplifier stack 730.

Figure 8:
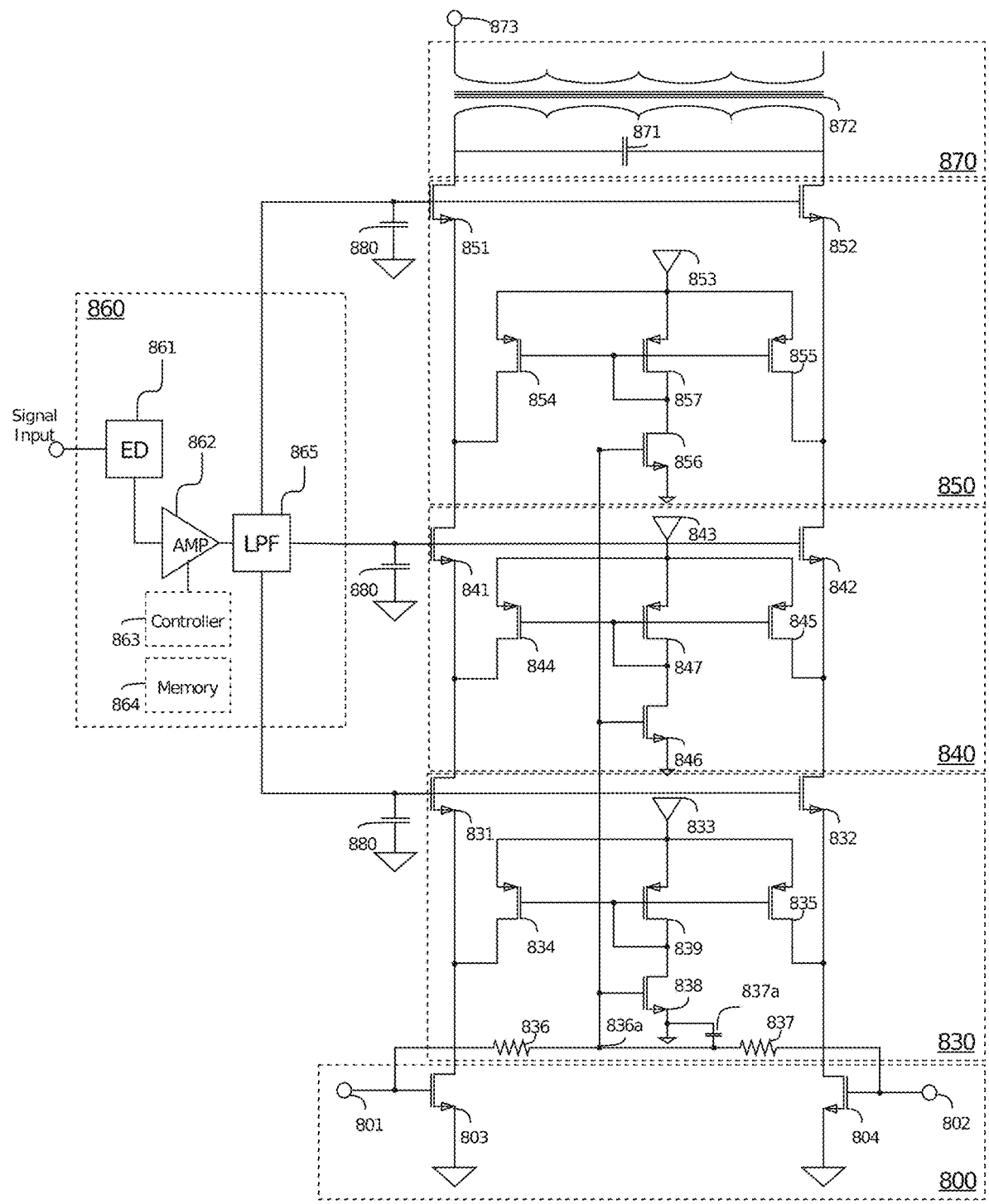
FIG. 8 shows schematically an example of an amplifier circuit in accordance with various aspects of this disclosure.

FIG. 8 shows schematically an example of an amplifier circuit in accordance with various aspects of this disclosure. The amplifier circuit may include an amplifier 800, a first amplifier stack 830, a second amplifier stack 840, a third amplifier stack 850, a processor 860, and a matching block 870. Aspects which are provided in this disclosure, in particular, the aspects in accordance with FIG. 5, FIG. 6, and FIG. 7 may also apply to FIG. 8, in particular in relation to the amplifier 800, amplifier stacks 830, 840, 850, and the processor 860. The amplifier circuit may alternatively be coupled to a processor of a radio communication circuit. When the amplifier circuit is coupled to the processor of the radio communication circuit, the processor of the radio communication circuit may perform similar aspects with the processor 860. In other words, the processor of the radio communication circuit may include the processor 860.

The amplifier 800 may include a transconductance amplifier in a differential configuration. The amplifier 800 may include two input terminals, a first input terminal 801 and a second input terminal 802 which are configured to receive a radio frequency (RF) input signal in differential pairs. The first input terminal 802 may be coupled to a gate terminal of a first transistor 803. The second input terminal may be coupled to a gate terminal of a second transistor 804. Each of the first transistor 803 and the second transistor 804 may include an N-type metal-oxide semiconductor (NMOS).

The first amplifier stack 830 may include a first transistor 831 and a second transistor 832 arranged in a differential configuration. The first transistor 831 of the first amplifier stack 830 and the second transistor 832 of the first amplifier stack 830 may be coupled to the amplifier 800 to receive an output signal of the amplifier 800. The first transistor 831 of the first amplifier stack 830 may be coupled to the first transistor 803 of the amplifier 800. The source terminal of the first transistor 831 of the first amplifier stack 830 may be coupled to the drain terminal of the first transistor 803 of the amplifier 800. The second transistor 832 of the first amplifier stack 830 may be coupled to the second transistor 804 of the amplifier 800. The source terminal of the second transistor 832 of the first amplifier stack 830 may be coupled to the drain terminal of the second transistor 804 of the amplifier 800. Each of the first transistor 831 of the first amplifier stack 830 and the second transistor 832 of the first amplifier stack 830 may include N-type metal-oxide-semiconductor (NMOS).

The first amplifier stack 830 may include a current source to provide input current from an electrical supply 833. The current source may be coupled to the electrical supply 833 to receive the electrical supply which may be provided as a supply voltage. The current source may include a first current source transistor 834, and a second current source transistor 835. A drain terminal of the first current source transistor 834 may be coupled to the source terminal of the first transistor 831 of the first amplifier stack 830, and a drain terminal of the second current source transistor 835 may be coupled to the source terminal of the second transistor 832 of the first amplifier stack 830. Each of the first current source transistor 834 the second current source transistor 835 may include P-type metal-oxide-semiconductor (PMOS).

The first amplifier stack 830 may include a bias circuit coupled to the current source. The bias circuit may include a first resistor 836, and a second resistor 837. The first resistor 836 and the second resistor 837 may be configured to receive the radio frequency (RF) input signal. The first input terminal 801 may be coupled to the first resistor 836 to provide the first differential pair of the radio frequency (RF) input signal to the first resistor 836. The second input terminal 802 may be coupled to the second resistor 837 to provide the second differential pair of the radio frequency (RF) input signal to the second resistor 837.

The bias circuit may further include, a first bias transistor 838 coupled to a coupling node 836*a* from a gate terminal, and the first resistor 836 and the second resistor 837 may be coupled to each other at the coupling node 836*a*. A capacitor 837*a* which may be coupled to the ground may be coupled to the coupling node 836*a*. The first bias transistor 838 may be used to arrange the supply voltage of a current source of the first amplifier stack 830 in combination with the first and second resistors 836, 837, the capacitor, and a second bias transistor 839. The first bias transistor 838 may include N type metal-oxide-semiconductor (NMOS).

The second bias transistor 839 may be coupled to the electrical supply 833 from its source terminal, and the drain terminal of the second bias transistor 839 may be coupled to the first bias transistor 838 which is configured to receive the differential voltage between the first input terminal 801 and the second input terminal 802. The differential voltage may be used to arrange the supply voltage of the current source of the first amplifier stack 830 via the bias circuit. The second bias transistor 839 may include P-type metal-oxide-semiconductor (PMOS). The drain terminal of the second bias transistor 839 may be coupled to a gate terminal of the first bias transistor 838, which the gate terminal of the second bias transistor 839 may be coupled to a gate terminal of the first transistor 831 of the first amplifier stack 830, and a gate terminal of the second transistor 832 of the amplifier stack 830.

Accordingly, the bias circuit may be configured to limit a direct current (DC) flowing from the amplifier 800 to the first amplifier stack 830 by dividing the direct current (DC) voltage provided to the first transistor 831 and the second transistor 832 of the amplifier stack 830 by the electrical supply 833 respectively.

The second amplifier stack 840, and the third amplifier stack 850 may be configured in a similar manner to the first amplifier stack 830. The second amplifier stack 840 may include a first transistor 841 and a second transistor 842 arranged in a differential configuration to receive an output signal of the first amplifier stack 830. The source terminal of the first transistor 841 of the second amplifier stack 840 may be coupled to the drain terminal of the first transistor 831 of the first amplifier stack 830. The source terminal of the second transistor 842 of the second amplifier stack 840 may be coupled to the drain terminal of the second transistor 832 of the first amplifier stack 830.

The second amplifier stack 840 may include a current source to provide input current from an electrical supply 843. The current source may include a first current source transistor 844, and a second current source transistor 845. A drain terminal of the first current source transistor 844 may be coupled to the source terminal of the first transistor 841, and a drain terminal of the second current source transistor 845 may be coupled to the source terminal of the second transistor 842. Each of the first current source transistor 844 the second current source transistor 845 may include P-type metal-oxide-semiconductor (PMOS). Further, the second amplifier stack 840 may include a bias circuit coupled to the current source to limit a direct current (DC) flowing from the first amplifier stack 830 to the second amplifier stack 840. The bias circuit may include a first bias transistor 846 configured to receive an input signal based on the input signal of the amplifier circuit from a gate terminal. Exemplarily, the gate terminal may be coupled to the coupling node 836*a*. The bias circuit may include a second bias transistor 847. The first bias transistor 846 may include an N-type metal-oxide-semiconductor (NMOS) and the second bias transistor 847 may include a P-type metal-oxide-semiconductor (PMOS).

The third amplifier stack 850 may include a first transistor 851 and a second transistor 852 arranged in a differential configuration to receive an output signal of the second amplifier stack 840. The source terminal of the first transistor 851 of the third amplifier stack 850 may be coupled to the drain terminal of the first transistor 841 of the second amplifier stack 840. The source terminal of the second transistor 852 of the third amplifier stack 850 may be coupled to the drain terminal of the second transistor 842 of the first amplifier stack 840.

The third amplifier stack 850 may include a current source to provide input current from an electrical supply 853. The current source may include a first current source transistor 854, and a second current source transistor 855. A drain terminal of the first current source transistor 854 may be coupled to the source terminal of the first transistor 851, and a drain terminal of the second current source transistor 855 may be coupled to the source terminal of the second transistor 852. Each of the first current source transistor 854 and the second current source transistor 855 may P-type metal-oxide-semiconductor (PMOS). Further, the third amplifier stack 850 may include a bias circuit coupled to the current source to limit a direct current (DC) flowing from the second amplifier stack 840 to the third amplifier stack 850. The bias circuit may include a first bias transistor 856 configured to receive an input signal based on the input signal of the amplifier circuit from a gate terminal. Exemplarily, the gate terminal may be coupled to the coupling node 836*a*. The bias circuit may include a second bias transistor 857. The first bias transistor 856 may include an N-type metal-oxide-semiconductor (NMOS) and the second bias transistor 857 may include a P-type metal-oxide-semiconductor (PMOS).

Various aspects that are provided in accordance with FIG. 5, FIG. 6, and FIG. 7 in this disclosure may also apply to FIG. 8, especially for the processor 860 regarding processors provided in accordance with FIG. 5, FIG. 6, and FIG. 7. The processor 860 may be configured to detect an envelope signal of a received signal. The processor 860 may include an envelope detector 861 configured to detect an envelope signal of a received signal.

The processor 860 may further adjust the amplitude and/or phase of the envelope signal. The processor 860 may adjust the amplitude and/or phase of the envelope signal to align the envelope signal to an envelope of the signal flowing through the source and drain terminals of the respective transistors 831, 832, 841, 842, 851, 852 of each of the amplifier stacks 830, 840, 850. The processor 860 may adjust the amplitude and/or phase of the envelope signal so that the gate-source and gate-drain cross voltages of the respective transistors 831, 832, 841, 842, 851, 852 of each of the amplifier stacks 830, 840, 850 in terms of envelopes of these signals become flatter. The processor 860 may adjust the amplitude and/or phase of the envelope signal to increase the correlation between the envelope of the signal between the gate-source terminals and the gate-drain terminals of the respective transistors 831, 832, 841, 842, 851, 852 of each of the amplifier stacks 830, 840, 850.

In accordance with various aspects disclosed herein, the processor 860 may adjust the amplitude and/or phase of the envelope signal to provide a first input control signal to the first amplifier stack 830, a second input control signal to the second amplifier stack 840, and a third input control signal to the third amplifier stack 850 (and further input control signals for other amplifier stacks) the respective transistors 831, 832, 841, 842, 851, 852 of each of the amplifier stacks 830, 840, 850, in order to increase the correlation between the envelope of the signal between the gate-source terminals and the gate-drain terminals of the respective transistors, and/or in order to keep the gain of the respective stack amplifier linear or constant, and/or in order to keep the ratio of the capacitance of the gate-source terminals and the capacitance of the drain-source terminals of the respective transistor linear or constant, and/or in order to reduce the memory effects for the respective amplifier stack.

The processor 860 may adjust the amplitude and/or phase of the envelope signal in order to keep the cross voltage between the gate terminal and source terminal of at least one of the transistors of the plurality of amplifier stacks substantially constant. The processor 860 may adjust the amplitude and/or phase of the envelope signal in order to reduce the cross voltage between the gate terminal and drain terminal of at least one of the transistors of the plurality of amplifier stacks substantially constant.

The processor 860 may adjust the amplitude and/or phase of the envelope signal by adjusting the amplitude and/or phase of the received signal (e.g. the radio frequency (RF) input signal, the output signal of an amplifier stack 830, 840, 850, the output signal of the amplifier circuit). The processor 860 may adjust the amplitude and/or phase of the envelope signal by adjusting the amplitude and/or phase of the envelope signal which is detected by the processor 860. The processor 860 may include any type of amplitude and/or phase adjusting methods, functions, or circuits. The processor 860 may include an amplifier block 862 to adjust the amplitude and/or phase of the envelope signal.

The processor 860 may include a controller 863 and a memory 864. The controller 863 may be configured to control the amplifier block 862 of the processor 860 to adjust the amplitude and/or phase of the received signal. The controller 863 may determine to adjust the amplitude and/or phase of the envelope signal in accordance with one or more predetermined parameters. The predetermined parameters may be stored in the memory 864. Accordingly, the controller 863 may determine an adjustment to be provided in the amplitude and/or phase of the envelope signal based on the predetermined parameters stored in the memory 864.

The first input control signal to be provided to a first transistor of an amplifier stack and the second control signal to be provided to a second transistor of an amplifier stack may have a phase difference of 180 degrees. In other words, the first input control signal and the second input control signal may be 180 degrees out of phase signals. Such out-of-phase difference existing at gate terminals of the respective transistors may lower the dynamic voltage stress to improve the reliability.

The controller 863 may receive a feedback signal from the amplifier 800, and/or from one of the amplifier stacks 830, 840, 850, and the controller 863 may determine an adjustment to be provided in the amplitude and/or phase of the envelope signal based on the feedback signal.

The controller 863 may receive at least one of: an amplifier feedback signal indicating a first bias voltage of at least one of the first transistor 803 and the second transistor 804 of the amplifier 800, and a first feedback signal indicating a second bias voltage of at least one of the first transistor 831 and the second transistor 832 of the first amplifier stack 830, and a second feedback signal indicating a third bias voltage of at least one of the first transistor 841 and the second transistor 842 of the second amplifier stack 840, and a third feedback signal indicating a fourth bias voltage of at least one of the first transistor 851 and the second transistor 852 of the third amplifier stack 850.

Exemplarily, the feedback signal may include an indication of the cross voltage between the gate terminal and the source terminal of the first transistor 831 and/or the second transistor 832. The feedback signal may include an indication of the gain of the amplifier stack, and/or an indication for the ratio of the capacitance of the gate-source terminals and/or the capacitance of the drain-source terminals of the first transistor 831 and/or the second transistor 832.

The controller 863 may determine the adjustment to be provided in amplitude and/or phase of the received signal to provide an input control signal to be provided to an amplifier stack based on the received feedback signal from the respective amplifier stack. Exemplarily, the controller 863 may determine the adjustment to be provided in amplitude and/or phase of the received signal to provide a first input control signal to the first amplifier stack 830 based on the first feedback signal. The controller 863 may determine the adjustment to be provided in amplitude and/or phase of the received signal to provide an input control signal to be provided to an amplifier stack based on the combination of at least two received feedback signals. Exemplarily, the controller 863 may determine the adjustment to be provided in amplitude and/or phase of the received signal to provide a first input control signal to the first amplifier stack 830 based on the first feedback signal and the amplifier feedback signal. The controller 863 may provide a threshold for the input control signal based on the envelope signal.

The controller 863 may be configured to perform different adjustments in amplitude and/or phase. The controller 863 may provide a first adjustment in amplitude and/or phase to the received signal, and the processor 860 may provide a first input control signal to the first amplifier stack 830; and the controller 863 may provide a second adjustment in amplitude and/or phase to the received signal, and the processor 860 may provide a second input control signal to the second amplifier stack 840.

The provided first adjustment in amplitude and/or phase may include changing at least one of amplitude or phase of the received signal with a first parameter, and the provided second adjustment in amplitude and/or phase may include changing at least one of the amplitude or phase of the received signal with a second parameter. The first input control signal and the second control signal may be different according to at least one of their amplitudes or phases.

The processor 860 may receive a first received signal based on a first differential portion of the radio frequency (RF) input signal provided to the first transistor 803 of the amplifier 800, and a second received signal based on a second differential portion of the radio frequency (RF) input signal provided to the second transistor 804 of the amplifier 800. The processor 860 may receive a first received signal, and a second received signal based on differential portions of the output signal of any one of the amplifier 800 or the amplifier stacks 830, 840, 850.

Accordingly, the controller 863 may determine a first adjustment in amplitude and/or phase of the first received signal to obtain the first input control signal, and a second adjustment in amplitude and/or phase of the second received signal to obtain the second input control signal in accordance with various aspects of this disclosure. The amplifier block 862 may provide the first adjustment in amplitude and/or phase to the first received signal to obtain the first input control signal, and the amplifier block 862 may provide the second adjustment in amplitude and/or phase to the second received signal to obtain the second control signal.

The processor 860 may include a low pass filter 865, and the amplifier block 862 provides an unfiltered input control signal to the low pass filter. Accordingly, the low pass filter 865 may filter out the noise and spurs which would fall to the filtered portion of the frequency band and may provide the input control signal to the respective amplifier stack 830, 840, 850.

Accordingly, the processor 860 may provide an input control signal after adjusting the amplitude and/or phase of the envelope signal based on a received signal. The input control signal may include the envelope of the input signal with an adjusted amplitude and/or phase. Alternatively, the processor 860 may receive the output signal of the amplifier 800 and may adjust the amplitude and/or phase of the output signal of the amplifier 800 and may provide the input control signal including the envelope of the output signal of the amplifier 800 with an adjusted amplitude and/or phase. In another example, the processor 860 may receive an output signal of any one of the amplifier stacks 830, 840, 850, and/or the output signal of the amplifier circuit and may adjust the amplitude and/or phase of the received signal and provides the input control signal including the envelope of the received signal with an adjusted amplitude and/or phase.

The matching block 870 may be coupled to the output of the third amplifier stack 850 to match the impedance. The matching block 870 may include a capacitor coupled to the third amplifier stack 850 and a transformer 872. The matching block 870 may further include an output to provide 873 the output signal of the amplifier circuit. The amplifier circuit may include the matching block 870.

Figure 9:
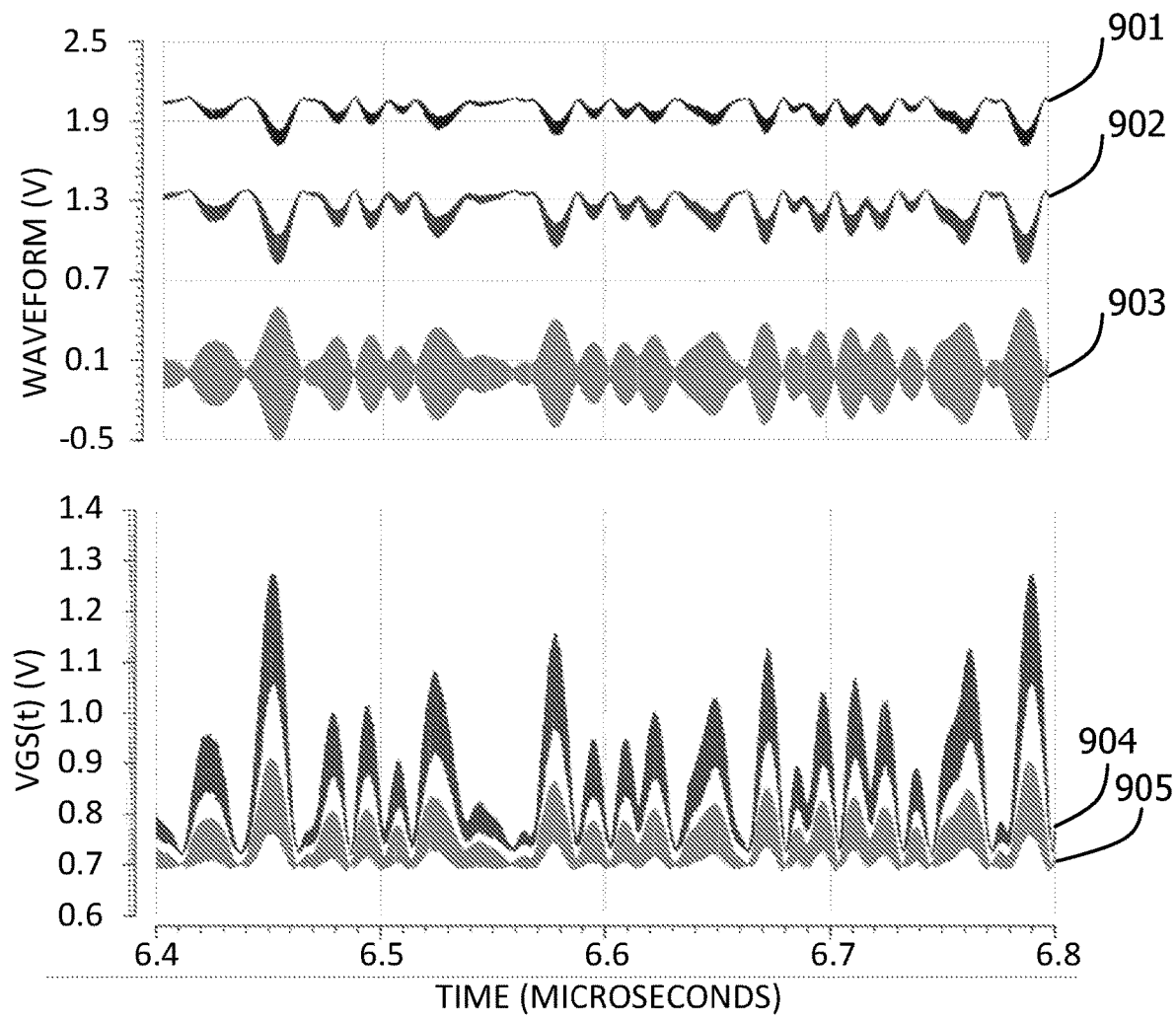
FIG. 9 shows schematically an exemplary diagram of voltages in time based on an input signal in accordance with various aspects of this disclosure.

FIG. 9 shows schematically an exemplary diagram of voltages in time based on an input signal. Referring to the amplifier circuit in FIG. 8, the exemplary diagram indicates measurements made in time in terms of voltage including voltage 901 representing the envelope signal at the gate terminal of the first transistor 831 of the first amplifier stack 830, voltage 902 representing the envelope signal at the source terminal of the first transistor 831 of the first amplifier stack 830, the radio frequency (RF) input signal 903, the gate-source voltage 904 of the first transistor 831 of the first amplifier stack 830 without aspects provided in this disclosure (e.g. envelope differences without the envelope signal being applied at the gate terminal), and the gate-source voltage 905 of the first transistor 831 of the first amplifier stack 830 in accordance with aspects provided in this disclosure (e.g. envelope differences with the envelope signal being applied at the gate terminal in accordance with various aspects of this disclosure).

Figure 10:
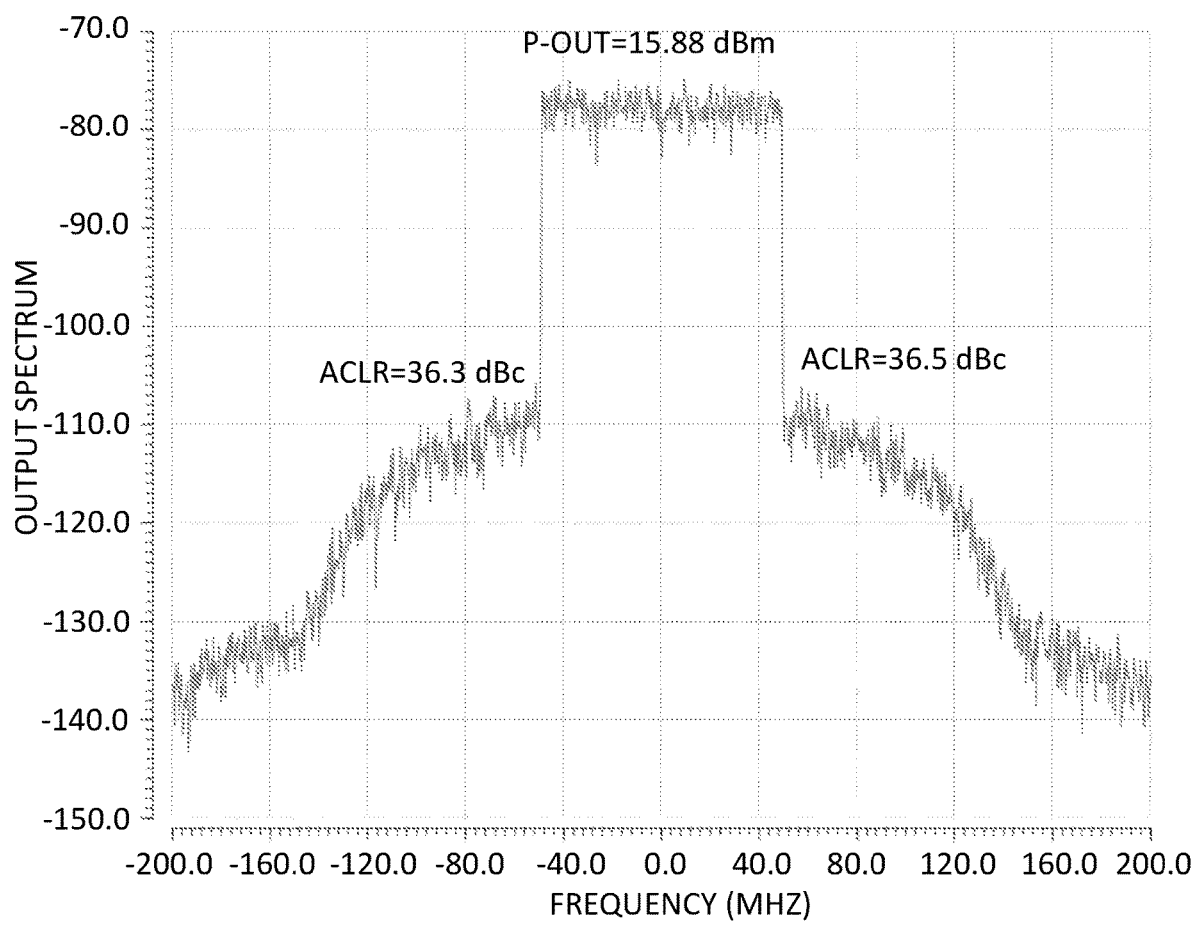
FIG. 10 shows schematically an exemplary diagram of output spectrum in accordance with various aspects of this disclosure.

FIG. 10 shows schematically an exemplary diagram of output spectrum. Referring to the amplifier circuit in FIG. 8, the exemplary diagram represents the output power spectrum of the amplifier circuit over frequency. The corresponding adjacent channel leakage ratios are calculated at 36.3 dBc and 36.5 dBc. The modulated output power is calculated as 15.88 dbM, at 38.7 mW. The drain efficiency provided with the final stage is calculated as 20.11%.

Figure 11:
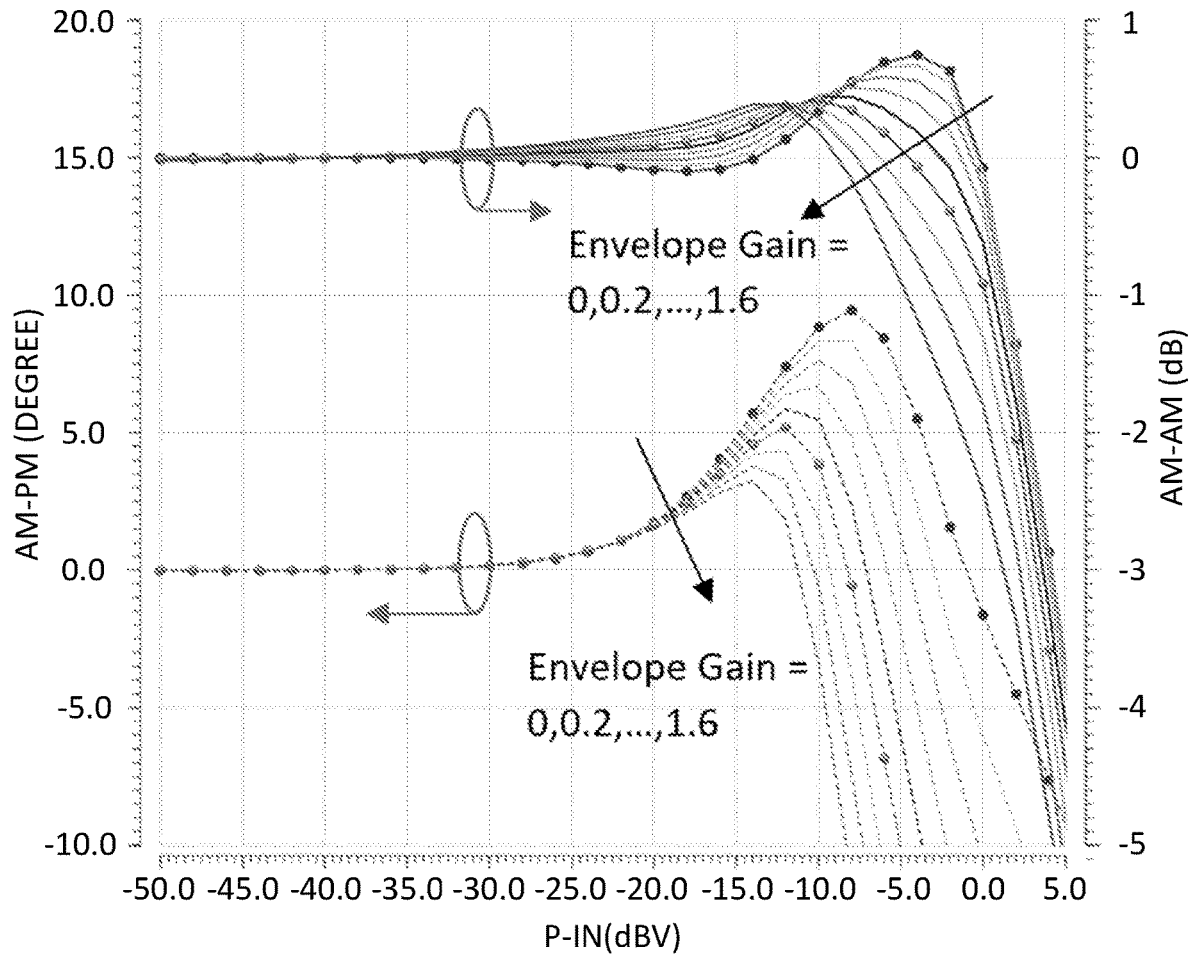
FIG. 11 shows schematically an exemplary diagram of AM-AM and AM-PM distortion plot based on various changes in amplitudes of an envelope signal.

FIG. 11 shows schematically an exemplary diagram of AM-AM and AM-PM distortion plot based on various changes in amplitudes of an envelope signal. The exemplary diagram represents the AM-AM and AM-PM distortion of the amplifier circuit according to input power in dBV. The distortions are provided for various changes in amplitudes of the envelope signal with various amplitude gains (0 to 1.6, 0.2 per step) in the direction of the arrows.

Figure 12:
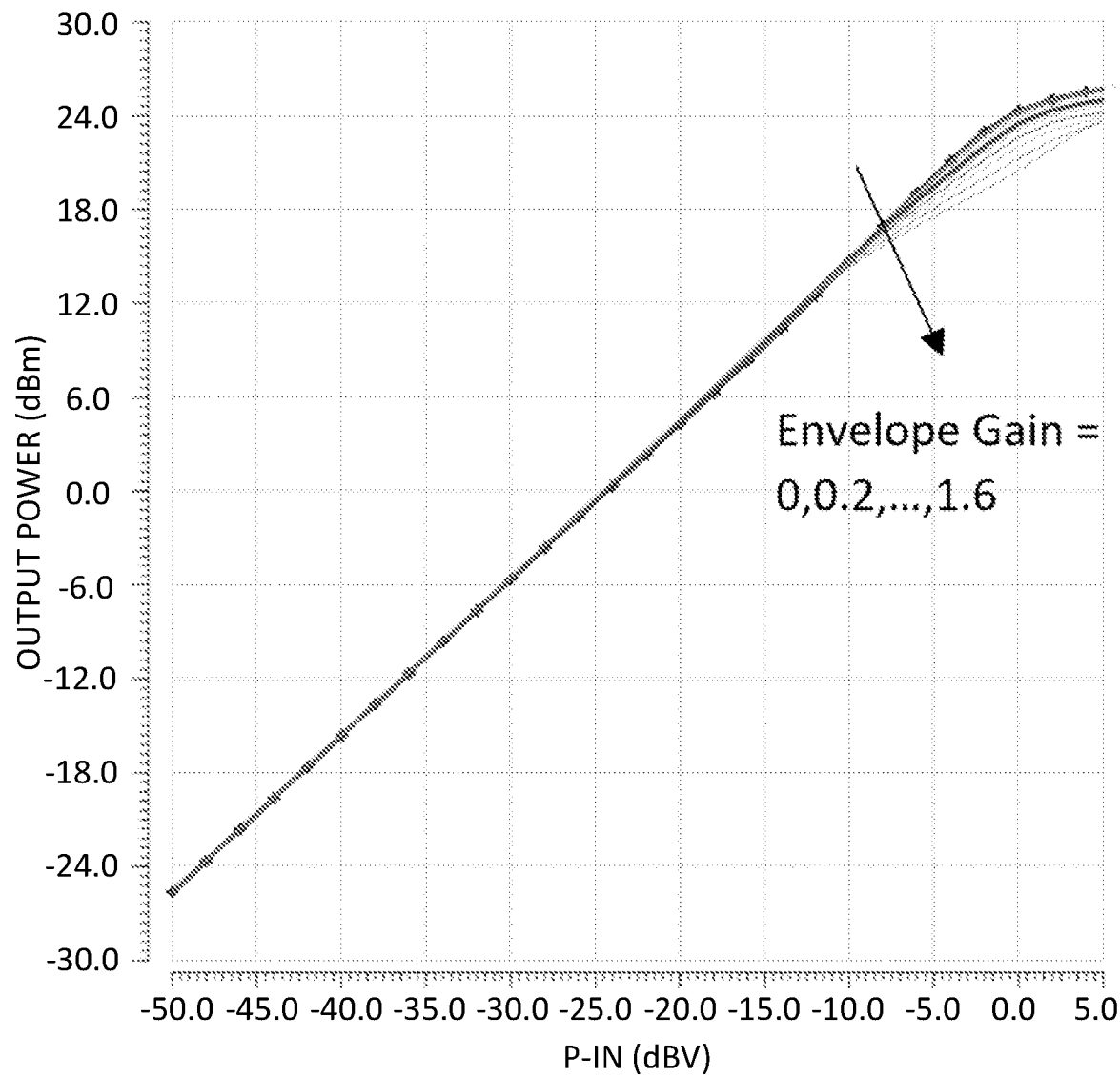
FIG. 12 shows schematically an exemplary diagram in relation with the input power and the output power of an amplifier circuit in accordance with various aspects of this disclosure.

FIG. 12 shows schematically an exemplary diagram in relation to the input power and the output power of an amplifier circuit. The exemplary diagram represents the output power according to input power provided for an exemplary amplifier circuit as shown in FIG. 8. The power relationships are provided for various changes in amplitudes of the envelope signal with various amplitude gains (0 to 1.6, 0.2 per step) in the direction of the arrow.

Figure 13:
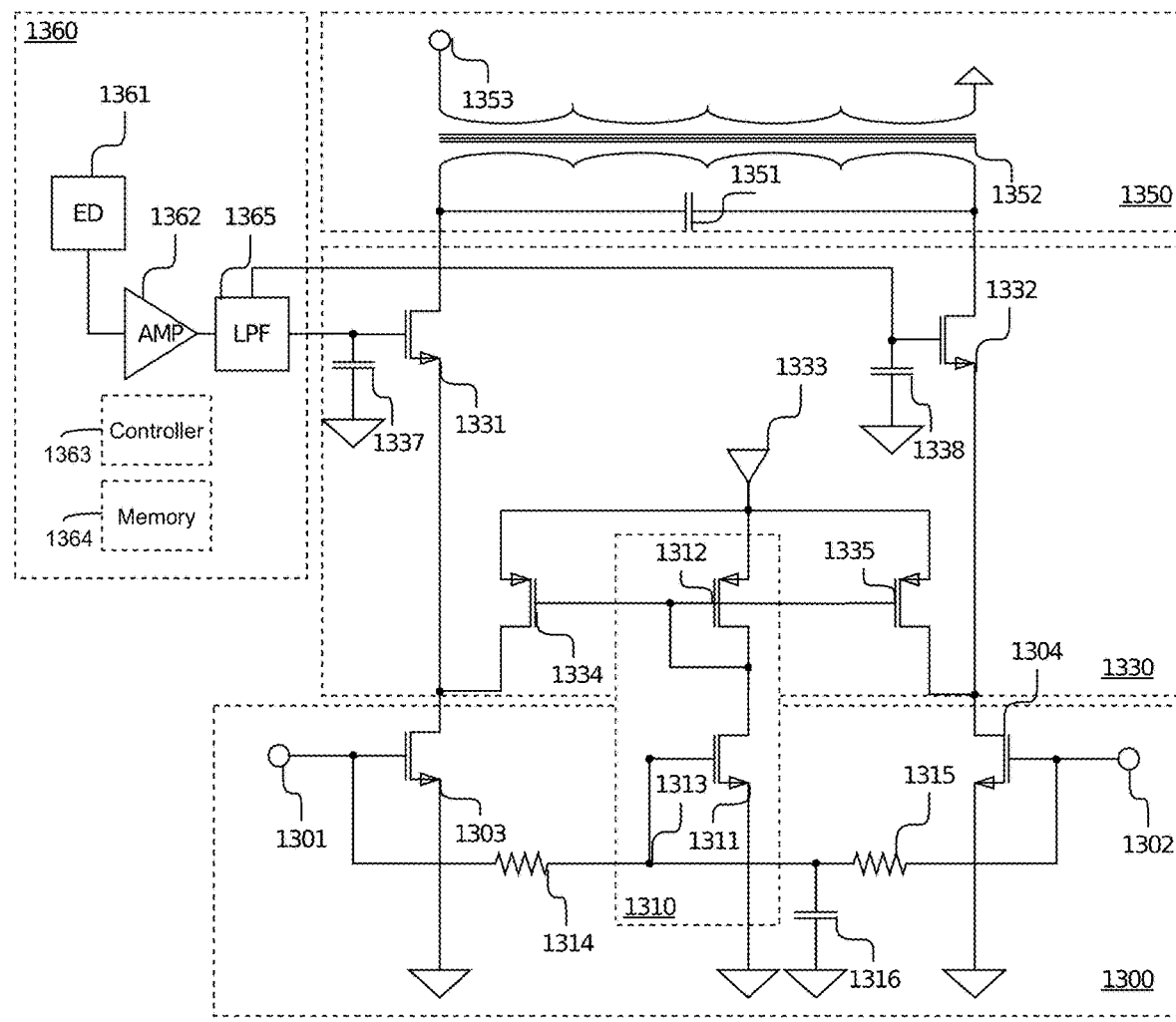
FIG. 13 shows schematically an example of an amplifier circuit in accordance with various aspects of this disclosure.

FIG. 13 shows schematically an example of an amplifier circuit. The amplifier circuit may include an amplifier 1300, an amplifier stack 1330, a matching block 1350, and a processor 1360. Aspects which are provided in this disclosure, in particular, the aspects in accordance with FIG. 5, FIG. 6, FIG. 7, and FIG. 8 may also apply to FIG. 13, in particular in relation to the amplifier 1300, the amplifier stack 1330, and the processor 1360. The amplifier circuit may alternatively be coupled to a processor of a radio communication circuit. When the amplifier circuit is coupled to the processor of the radio communication circuit, the processor of the radio communication circuit may perform similar aspects with the processor 1360. In other words, the processor of the radio communication circuit may include the processor 1360.

The amplifier 1300 may include a transconductance amplifier in a differential configuration. The amplifier 1300 may include two input terminals, a first input terminal 1301 and a second input terminal 1302 which are configured to receive a radio frequency (RF) input signal in differential pairs. The first input terminal may be coupled to a gate terminal of a first transistor 1303. The second input terminal may be coupled to a gate terminal of a second transistor 1304. Each of the first transistor 1304 and the second transistor 1305 may include an N-type metal-oxide semiconductor (NMOS).

The amplifier stack 1330 may include a first transistor 1331 and a second transistor 1332 arranged in a differential configuration. The first transistor 1331 of the amplifier stack 1330 and the second transistor 1332 of the amplifier stack 1330 are coupled to the amplifier 1300 to receive an output signal of the amplifier 1300. The source terminal of the first transistor 1331 of the amplifier stack 1330 may be coupled to the drain terminal of the first transistor 1303 of the amplifier 1300. The source terminal of the second transistor 1332 of the amplifier stack 1330 may be coupled to the drain terminal of the second transistor 1304 of the amplifier 1300. The first transistor 1331 and the second transistor 1332 of the amplifier stack 1330 include an N-type metal-oxide-semiconductor (NMOS).

The amplifier stack 1330 may include a current source to provide input current from an electrical supply 1333. The current source may be coupled to the electrical supply 1333 to receive the electrical supply which may be provided as a supply voltage. The current source may include a first current source transistor 1334, and a second current source transistor 1335. A drain terminal of the first current source transistor 1334 may be coupled to the source terminal of the first transistor 1331 of the amplifier stack 1330, and a drain terminal of the second current source transistor 1335 may be coupled to the source terminal of the second transistor 1332 of the amplifier stack 1330. The first current source transistor 1334 the second current source transistor 1335 include P-type metal-oxide-semiconductor (PMOS).

The amplifier circuit may include a bias circuit 1310 coupled to the current source of the amplifier stack 1330. The bias circuit may include, a first bias transistor 1311 and a second bias transistor 1313. The first bias transistor may be coupled to a coupling node 1313 from a gate terminal to receive a signal based on the input signal. In this example, a first resistor 1314 and a second resistor 1315 may be coupled to each other at the coupling node 1313. The first resistor 1314 and the second resistor 1315 are configured to receive the radio frequency (RF) input signal from the first input terminal 1301 and the second input terminal respectively. A capacitor 1316 which may be coupled to the ground may be coupled to the coupling node.

The second bias transistor 1313 may be coupled to the electrical supply 1333 from its source terminal, and the drain terminal of the second bias transistor 1313 may be coupled to the first bias transistor 1311 which is configured to receive the differential voltage between the first input terminal 1301 and the second input terminal 1313 by its gate terminal. The differential voltage may be used to arrange the supply voltage of the current source of the amplifier stack 1330 via the bias circuit 1300. The first bias transistor 1311 may include an N-type metal-oxide-semiconductor (NMOS) and the second bias transistor 1313 may include a P-type metal-oxide-semiconductor (PMOS). The gate terminal and the drain terminal of the second bias transistor 1313 are coupled to the gate terminal of the first current source transistor 1334 and the gate terminal of the second current source transistor.

Accordingly, the bias circuit 1300 may be configured to limit a direct current (DC) flowing from the amplifier 1300 to the amplifier stack 1330 by dividing the direct current (DC) voltage provided to the first transistor 1331 and the second transistor 1332 of the amplifier stack 1330 by the electrical supply 1333 respectively.

The amplifier circuit may include one amplifier stack, the amplifier stack 1330. The output of the amplifier stack 1330 may be coupled to the matching block 1350 to match the impedance. The drain terminal of the first transistor 1331 of the amplifier stack 1330, and the drain terminal of the second transistor 1332 of the amplifier stack 1330 are coupled to a decoupling capacitor 1351, and a transformer 1352. Accordingly, the amplifier circuit may provide an amplifier circuit output signal from an amplifier circuit output 1353.

The amplifier stack 1330 may include a first decoupling capacitor 1337 and a second decoupling capacitor 1338. The first decoupling capacitor 1337 may be coupled to an input to receive a first input control signal to control the first transistor 1331 and the second decoupling capacitor 1338 may be coupled to another input to receive a second input control signal to control the second transistor 1332. Alternatively, the radio communication circuit may provide the decoupling capacitors which may be equivalent to the first decoupling capacitor 1337 and the second decoupling capacitor 1338 to filter out the direct current (DC) component of the first and second input control signals.

The processor 1360 may receive the input signal which may include the radio frequency (RF) input signal, and the processor 1360 may provide the first input control signal and the second input control signal which are based on the envelope of the input signal to the amplifier 1300. In another example, the processor 1360 may receive an input signal which may include the amplifier circuit output signal (which may also be the output signal of the amplifier stack 1330) received from the amplifier circuit output 1353 and the processor 1360 may provide the first input control signal and the second input control signal which are based on the envelope of the amplifier circuit output signal to the amplifier stack 1330, which the amplifier circuit output signal may include an amplified version of the radio frequency (RF) input signal. The processor 1360 may receive at least two of the radio frequency (RF) input signal and/or the output signal of the amplifier stack 1330 an/or the amplifier circuit output signal to provide the first input control signal and the second input control signal. The processor 1360 may include an envelope detector 1361 configured to detect an envelope signal of a received signal.

The processor 1360 may further adjust the amplitude and/or phase of the envelope signal. The processor 1360 may adjust the amplitude and/or phase of the envelope signal in order to align the envelope signal to an envelope of the signal flowing through the source and drain terminals of the first transistor 1331 and/or the second transistor 1332 of the amplifier stack 1330. The processor 1360 may adjust the amplitude and/or phase of the envelope signal so that the gate-source and gate-drain cross voltages of the first transistor 1331 and/or the second transistor 1332 of the amplifier stack 1330 in terms of envelopes of these signals become flatter. The processor 1360 may adjust the amplitude and/or phase of the envelope signal to increase the correlation between the envelope of the signal between the gate-source terminals and the gate-drain terminals of the first transistor 1331 and/or the second transistor 1332 of the amplifier stack 1330.

In accordance with various aspects disclosed herein the processor 1360 may adjust the amplitude and/or phase of the envelope signal to provide the first input control signal and the second input control signal (and further input control signals for other amplifier stacks) for the transistors of each stack of the plurality of stacks, in order to increase the correlation between the envelope of the signal between the gate-source terminals and the gate-drain terminals of the respective transistors, and/or in order to keep the gain of the respective stack amplifier linear or constant, and/or in order to keep the ratio of the capacitance of the gate-source terminals and the capacitance of the drain-source terminals of the respective transistor linear or constant, and/or in order to reduce the memory effects for the respective amplifier stack.

The processor 1360 may adjust the amplitude and/or phase of the envelope signal in order to keep the cross voltage between the gate terminal and source terminal of at least one of the transistors of the plurality of amplifier stacks substantially constant. The processor 1360 may adjust the amplitude and/or phase of the envelope signal in order to reduce the cross voltage between the gate terminal and drain terminal of at least one of the transistors of the plurality of amplifier stacks substantially constant.

The processor 1360 may adjust the amplitude and/or phase of the envelope signal to provide a first input control signal to the first transistor 1331 and/or a second input control signal to the second transistor 1332 of the amplifier stack 1330 (and further input control signals for other amplifier stacks).

The processor 1360 may adjust the amplitude and/or phase of the envelope signal by adjusting the amplitude and/or phase of the received signal (e.g. the radio frequency (RF) input signal, the output signal of the amplifier stack 1330, the output signal of the amplifier circuit). The processor 1360 may adjust the amplitude and/or phase of the envelope signal by adjusting the amplitude and/or phase of the envelope signal which is detected by the processor 1360. The processor 1360 may include any type of amplitude and/or phase adjusting methods, functions, or circuits. The processor 1360 may include an amplifier block 1362 to adjust the amplitude and/or phase of the envelope signal. The amplifier block 1362 may include a first amplifier block and a second amplifier block to perform different adjustments in order to provide the first input control signal and the second input control signal.

The processor 1360 may include a controller 1363 and a memory 1364. The controller 1363 may be configured to control the amplifier block 1362 of the processor 1360 to adjust the amplitude and/or phase of the received signal. The controller 1363 may determine to adjust the amplitude and/or phase of the envelope signal in accordance with one or more predetermined parameters. The predetermined parameters are stored in the memory 1364. Accordingly, the controller 1363 determines an adjustment to be provided in the amplitude and/or phase of the envelope signal based on the predetermined parameters stored in the memory 1364. The controller 1363 may receive a feedback signal from the amplifier 1300, and/or from the amplifier stack 1330, or the output of the amplifier circuit, and the controller 1363 may determine an adjustment to be provided in the amplitude and/or phase of the envelope signal based on the feedback signal to obtain the first input control signal and/or the second input control signal.

The controller 1363 may receive at least one of: a first amplifier feedback signal indicating a first bias voltage of the first transistor 1303 of the amplifier 1300, and a second amplifier feedback signal indicating a second bias voltage of the second transistor 1304 of the amplifier 1300, and a first feedback signal indicating a third bias voltage of the first transistor 1331 of the amplifier stack 1330, and a second feedback signal indicating a fourth bias voltage of the second transistor 1332 of the amplifier stack 1330.

The controller 1363 may determine the adjustment to be provided in amplitude and/or phase of the received signal to provide an input control signal based on the received feedback signal from the respective transistor of the amplifier stage 1330. Exemplarily, the controller 1363 determines the adjustment to be provided in amplitude and/or phase of the received signal to provide the first input control signal based on the first feedback signal. The controller 1363 may determine the adjustment to be provided in amplitude and/or phase of the received signal to provide the second input control signal based on the second feedback signal. The controller 1363 may determine the adjustments based on a combination of at least two received feedback signals. The controller 1363 may provide a threshold for the input control signal based on the envelope signal.

The controller 1363 may be configured to perform different adjustments in amplitude and/or phase. Exemplarily, the controller 1363 may provide a first adjustment in amplitude and/or phase to the received signal, and the processor 1360 may provide the first input control signal to the first transistor 1331 of the amplifier stack 1330; and the controller 1363 may provide a second adjustment in amplitude and/or phase to the received signal, and the processor 1360 may provide the second input control signal to the second transistor 1332 of the amplifier stack 1330.

The provided first adjustment in amplitude and/or phase may include changing at least one of amplitude or phase of the received signal with a first parameter, and the provided second adjustment in amplitude and/or phase may include changing at least one of the amplitude or phase of the received signal with a second parameter. The first input control signal and the second control signal are different according to at least one of their amplitudes or phases. The first input control signal and the second control signal have a phase difference of 180 degrees. In other words, the first input control signal and the second input control signal are 180 degrees out of phase signals. Such out-of-phase difference existing at gate terminals of the first transistor 1331 and the second transistor 1332 may lower the dynamic voltage stress to improve the reliability.

Exemplarily, the processor 1360 may receive a first received signal based on a first differential portion of the radio frequency (RF) input signal provided to the first transistor 1303 of the amplifier 1300, and a second received signal based on a second differential portion of the radio frequency (RF) input signal provided to the second transistor 1304 of the amplifier 1300. The processor 1360 may receive a first received signal, and a second received signal based on differential portions of the output signal of the amplifier stack 1330.

The controller 1363 may determine a first adjustment in amplitude and/or phase of the first received signal to obtain the first input control signal, and a second adjustment in amplitude and/or phase of the second received signal to obtain the second input control signal. The amplifier block 1362 may provide the first adjustment in amplitude and/or phase to the first received signal to obtain the first input control signal, and the amplifier block 1362 may provide the second adjustment in amplitude and/or phase to the second received signal to obtain the second control signal.

The processor 1360 may include a low pass filter 1365, and the amplifier block 1362 may provide an unfiltered input control signal to the low pass filter. Accordingly, the low pass filter 1365 may filter out the noise and spurs which would fall to the filtered portion of the frequency band, and may provide the first input control signal and the second input control signal to the amplifier stack 1330. Accordingly, the processor 1360 may provide the first input control signal and the second input control signal after adjusting the amplitude and/or phase of the envelope signal based on at least one received signal.

In an example, a radio communication circuit may include an up-converter configured to upconvert a baseband communication signal to a radio frequency (RF) communication signal, and an amplifier circuit in accordance with various aspects of this disclosure which receives the radio frequency (RF) communication signal. A radio communication device may include the radio communication circuit including an amplifier circuit in accordance with various aspects of this disclosure, and an antenna configured to transmit an output signal provided by the amplifier circuit. The radio communication device may include a baseband processor configured to provide the baseband communication signal.

In an example, a radio communication device may include, a computer-readable medium including instructions stored thereon, that if executed by a processor, implement a method including: amplifying an input signal to provide an output signal by an amplifier, receiving the output signal by an amplifier stack comprising a first transistor coupled to the amplifier, controlling the first transistor based on an envelope of the input signal, amplifying the output signal using the first transistor. A device, e.g. a communication device may include a memory, and one or more processors, such as processing circuitry 402 and memory 403 referring back to FIG. 4. The memory 403 may be implemented as a computer-readable medium including instructions stored thereon, that if executed by a processor implement a method including: amplifying an input signal to provide an output signal by an amplifier, receiving the output signal by an amplifier stack comprising a first transistor coupled to the amplifier, controlling the first transistor based on an envelope of the input signal, amplifying the output signal using the first transistor.

Figure 14:
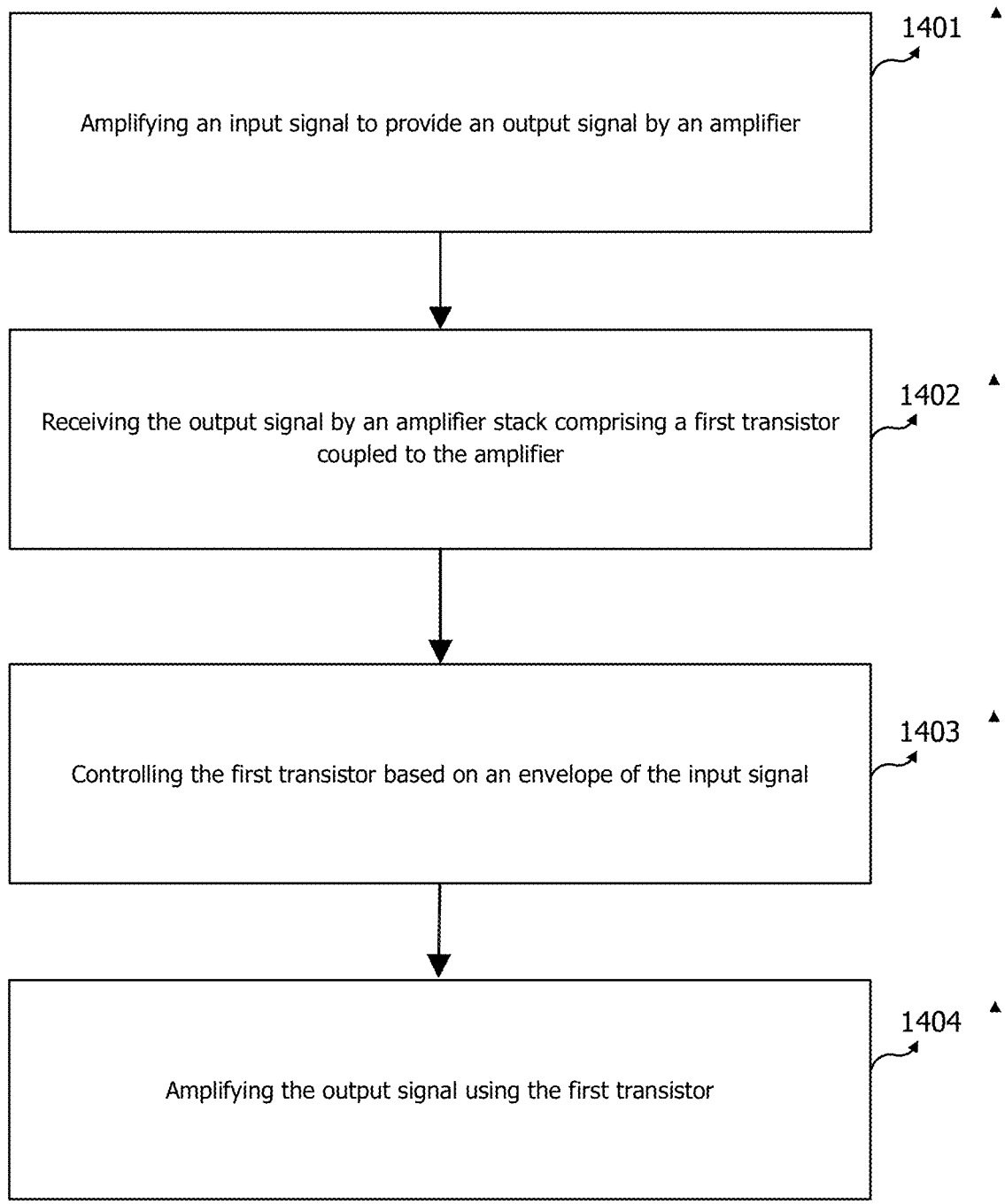
FIG. 14 shows schematically an example of method steps in accordance with various aspects of this disclosure.

FIG. 14 shows schematically an example of a method. The method may include amplifying an input signal to provide an output signal by an amplifier, receiving the output signal by an amplifier stack comprising a first transistor coupled to the amplifier, controlling the first transistor based on an envelope of the input signal, amplifying the output signal using the first transistor.

The following examples pertain to further aspects of this disclosure.

Example 1 includes an amplifier circuit. the subject matter may include: an amplifier configured to amplify an input signal to provide an output signal; an amplifier stack may include a first transistor coupled to the amplifier, the amplifier stack is configured to: receive the output signal to amplify the output signal, receive an input control signal to control the first transistor based on an envelope of the input signal.

In example 2, the subject matter of example 1, may further include a processor may include an envelope detector to detect an envelope signal of a received signal; the processor is configured to: adjust an amplitude and/or a phase of the envelope signal; and provide the input control signal based on the adjusted envelope signal.

In example 3, the subject matter of example 2, can optionally include that the received signal includes the input signal received by the amplifier. In example 4, the subject matter of example 2 or example 3, may further include an amplifier circuit output configured to provide an amplifier output signal based on the input signal received by the amplifier; and can optionally include that the processor is configured to receive the amplifier output signal.

In example 5, the subject matter of any one of examples 2 to 4, can optionally include that the processor is configured to adjust the amplitude and/or the phase of the envelope signal to align the envelope signal to the output signal. In example 6, the subject matter of any one of examples 2 to 5, can optionally include that the processor is configured to adjust the amplitude and/or the phase of the envelope signal to keep a cross voltage between the gate terminal and the source terminal of the first transistor substantially constant, and/or to reduce the cross voltage between the gate terminal and the drain terminal of the first transistor.

In example 7, the subject matter of any one of examples 2 to 6, can optionally include that the processor is configured to adjust the amplitude and/or the phase of the envelope signal to align the envelope signal to an envelope of the signal flowing through the source and drain terminals of the first transistor.

In example 8, the subject matter of any one of examples 2 to 7, can optionally include that the processor is configured to increase the correlation between the envelope of the signal between the gate-source terminals and the gate-drain terminals of the first transistor.

In example 9, the subject matter of any one of examples 2 to 8, can optionally include that the processor is configured to keep the gain of the amplifier stack, or the first transistor, constant.

In example 10, the subject matter of any one of examples 2 to 9, can optionally include that the processor is configured to keep the gain of the amplifier stack, or the first transistor, linear.

In example 11, the subject matter of any one of examples 2 to 10, can optionally include that the processor is configured to keep the ratio of the capacitance of the gate-source terminals and the capacitance of the drain-source terminals of the first transistor constant.

In example 12, the subject matter of any one of examples 2 to 11, can optionally include that the processor is configured to keep the ratio of the capacitance of the gate-source terminals and the capacitance of the drain-source terminals of the first transistor linear.

In example 13, the subject matter of any one of examples 2 to 12, can optionally include that the processor is configured to reduce memory effects.

In example 14, the subject matter of any one of examples 2 to 14, can optionally include that the processor is configured to receive a feedback signal, and adjust the amplitude and/or phase of the envelope signal based on the feedback signal.

In example 15, the subject matter of any one of examples 2 to 14, can optionally include that the processor is configured to receive a feedback signal including an indication of the cross voltage between the gate terminal and the source terminal of the first transistor.

In example 16, the subject matter of any one of examples 2 to 15, can optionally include that the processor is configured to receive a feedback signal including an indication of the gain of the amplifier stack.

In example 17, the subject matter of any one of examples 2 to 16, can optionally include that the processor is configured to receive a feedback signal including an indication of the gain of the amplifier.

In example 18, the subject matter of any one of examples 2 to 17, can optionally include that the processor is configured to receive a feedback signal including an indication of the gain of the amplifier circuit.

In example 19, the subject matter of any one of examples 2 to 18, can optionally include that the processor is configured to receive a feedback signal including an indication for the ratio of the capacitance of the gate-source terminals and/or the capacitance of the drain-source terminals of the first transistor.

In example 20, the subject matter of any one of examples 2 to 19, may further include a plurality of amplifier stacks may include a first amplifier stack including the amplifier stack; and a second amplifier stack configured to receive a second input control signal from the processor to control a first transistor of the second amplifier stack based on an envelope of the input signal. In example 21, the subject matter of example 20, can optionally include that the processor is configured to adjust the amplitude and/or the phase of the envelope signal to obtain the second input control signal which is different from the input control signal.

In example 22, the subject matter of any one of examples 20 to 21, can optionally include that the processor is configured to provide a first adjustment in amplitude and/or phase to the received signal to obtain a first input control signal for the first amplifier stack; and provide a second adjustment in amplitude and/or phase to the received signal to obtain a second input control signal for the second amplifier stack.

In example 23, the subject matter of any one of examples 20 to 22, can optionally include that the processor is configured to receive a first feedback signal from the first amplifier stack, and receive a second feedback signal from the second amplifier stack.

In example 24, the subject matter of example 23 can optionally include that the processor is configured to provide the first adjustment in amplitude and/or phase to the received signal based on the first feedback signal; and provide the second adjustment in amplitude and/or phase to the received signal based on the second feedback signal.

In example 25, the subject matter of any one of examples 20 to 24, can optionally include that the processor is configured to receive a second received signal, and to provide the first input control signal based on the received signal, and the second input control signal based on the second received signal.

In example 26, the subject matter of any one of examples 23 to 25, can optionally include that the processor is configured to provide an adjustment in amplitude and/or phase to the second received signal.

In example 27, the subject matter of any one of examples 23 to 26, can optionally include that the processor is configured to provide the first adjustment in amplitude and/or phase to the received signal based on the first feedback signal; and provide the second adjustment in amplitude and/or phase to the second received signal based on the second feedback signal.

In example 28, the subject matter of any one of examples 2 to 27, can optionally include that the processor is configured to adjust the amplitude and/or phase of the received signal based on a parameter stored in a memory.

In example 29, the subject matter of any one of examples 20 to 28, can optionally include that the processor is configured to receive the output signal from the amplifier; adjust an amplitude and/or a phase of an envelope of the received output signal to obtain the second input control signal. In example 29, the subject matter of example 28, can optionally include that the first input control signal and the second input control signal are 180 degrees out of phase signals. In example 30, the subject matter of any one of examples 20 to 29, may further include an amplifier stack partial shunt circuit to limit a direct current (DC) flowing from the first amplifier stack to the second amplifier stack.

In example 31, the subject matter of any one of examples 1 to 30, can optionally include that the input control signal is received by a gate terminal of the first transistor, and the first transistor may be coupled to the amplifier by a source terminal. In example 32, the subject matter of any one of examples 1 to 31, may further include a low pass filter coupled between the processor and the gate terminal of the first transistor. In example 33, the subject matter of example of any one of examples 2 to 32, can optionally include that the processor is configured to adjust the amplitude and/or the phase of the envelope signal to keep a capacitance between the gate terminal and the source terminal of the first transistor substantially constant.

In example 34, the subject matter of any one of examples 1 to 33, can optionally include that the amplifier stack includes a second transistor configured to be coupled to the first transistor in a differential configuration; and the input control signal is received by a gate terminal of the second transistor. In example 35, the subject matter of any one of examples 2 to 34, can optionally include that the amplifier stack includes a second transistor configured to be coupled to the first transistor in a differential configuration; can further include that the processor is configured to provide a second input control signal based on the envelope of the input signal; and the second input control signal is received by a gate terminal of the second transistor.

In example 36, the subject matter of any one of examples 1 to 35, can optionally include that the amplifier includes a differential transconductance amplifier may include a first transistor and a second transistor, and a drain terminal of the first transistor of the amplifier may be coupled to a source terminal of the first transistor of the amplifier stack, and a drain terminal of the second transistor of the amplifier may be coupled to a source terminal of the second transistor of the amplifier stack.

In example 37, the subject matter of any one of examples 1 to 36, may further include a partial shunt circuit to limit a DC current flowing from the amplifier to the amplifier stack. In example 38, the subject matter of any one of examples 1 to 37, can optionally include that the amplifier stack includes a current source circuit may include a current source transistor, can optionally include that the first transistor of the amplifier stack includes an N-type metal-oxide-semiconductor (NMOS), and the current source transistor includes a P-type metal-oxide semiconductor (PMOS).

In example 39, the subject matter includes a radio communication circuit. The radio communication circuit may include: an up-converter configured to up-convert a baseband communication signal to a radio frequency (RF) communication signal; and an amplifier circuit according to any one of examples 1 to 38. In example 40, the subject matter of example 39, may further include: a processor configured to: detect an envelope signal of a received signal; adjust an amplitude and/or a phase of the envelope signal; and provide the input control signal based on the adjusted envelope signal.

In example 41, the subject matter includes a radio communication device. The radio communication device may include: a radio communication circuit according to example 39 or example 40; an amplifier circuit output configured to provide an amplifier output signal based on the input signal received by the amplifier; and an antenna configured to transmit the amplifier output signal. In example 42 the subject matter of example 39 may further include: a baseband processor configured to provide the baseband communication signal.

In example 43, the subject matter is a method. The method may include: amplifying an input signal to provide an output signal by an amplifier; receiving the output signal by an amplifier stack may include a first transistor coupled to the amplifier; controlling the first transistor based on an envelope of the input signal; amplifying the output signal using the first transistor. In example 44, the subject matter of example 43, may include: adjusting an amplitude and/or a phase of the envelope of the input signal.

The word "exemplary" is used herein to mean "serving as an example, instance, or illustration". Any aspect or design described herein as "exemplary" is not necessarily to be construed as preferred or advantageous over other aspects or designs.

Throughout the drawings, it should be noted that like reference numbers are used to depict the same or similar elements, features, and structures, unless otherwise noted. It should be noted that certain components may be omitted for the sake of simplicity. It should be noted that nodes (dots) are provided to identify the circuit line intersections in the drawings including electronic circuit diagrams.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. For instance, the phrase "a plurality" may be understood to include a numerical quantity greater than or equal to two (e.g., two, three, four, five, [ . . . ], etc.).

As used herein, a signal that is "indicative of" or "indicating" a value or other information may be a digital or analog signal that encodes or otherwise communicates the value or other information in a manner that can be decoded by and/or cause a responsive action in a component receiving the signal. The signal may be stored or buffered in computer-readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

As used herein, a signal may be transmitted or conducted through a signal chain in which the signal is processed to change characteristics such as phase, amplitude, frequency, and so on. The signal may be referred to as the same signal even as such characteristics are adapted. In general, so long as a signal continues to encode the same information, the signal may be considered as the same signal. For example, a transmit signal may be considered as referring to the transmit signal in baseband, intermediate, and radio frequencies.

The terms "processor" or "controller" as, for example, used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The terms "one or more processors" is intended to refer to a processor or a controller. The one or more processors may include one processor or a plurality of processors. The terms are simply used as an alternative to the "processor" or "controller".

As utilized herein, terms "module", "component," "system," "circuit," "element," "slice," "circuit," and the like are intended to refer to a set of one or more electronic components, a computer-related entity, hardware, software (e.g., in execution), and/or firmware. For example, circuit or a similar term can be a processor, a process running on a processor, a controller, an object, an executable program, a storage device, and/or a computer with a processing device. By way of illustration, an application running on a server and the server can also be circuit. One or more circuits can reside within the same circuit, and circuit can be localized on one computer and/or distributed between two or more computers. A set of elements or a set of other circuits can be described herein, in which the term "set" can be interpreted as "one or more."

As used herein, "memory" is understood as a computer-readable medium (e.g., a non-transitory computer-readable medium) in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, 3D Points, among others, or any combination thereof. Registers, shift registers, processor registers, data buffers, among others, are also embraced herein by the term memory. The term "software" refers to any type of executable instruction, including firmware.

The term "antenna", as used herein, may include any suitable configuration, structure and/or arrangement of one or more antenna elements, components, units, assemblies and/or arrays. The antenna may implement transmit and receive functionalities using separate transmit and receive antenna elements. The antenna may implement transmit and receive functionalities using common and/or integrated transmit/receive elements. The antenna may include, for example, a phased array antenna, a single element antenna, a set of switched beam antennas, and/or the like.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "provided" to an element, the voltage, current, or signal may be conducted to the element by way of a physical connection or by way of capacitive, electro-magnetic, or inductive coupling that does not involve a physical connection.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), Time-Division Multiplexing (TDM), Time-Division Multiple Access (TDMA), Multi-User MIMO (MU-MIMO), General Packet Radio Service (GPRS), extended GPRS (EGPRS), Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth (BT), Global Positioning System (GPS), Wi-Fi, Wi-Max, Zig-Bee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems and/or networks.

Some demonstrative aspects may be used in conjunction with a WLAN, e.g., a WiFi network. Other aspects may be used in conjunction with any other suitable wireless communication network, for example, a wireless area network, a "piconet", a WPAN, a WVAN and the like.

Some aspects may be used in conjunction with a wireless communication network communicating over a frequency band of 2.4 GHz, 5 GHz, and/or 6-7 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a WLAN frequency band, a WPAN frequency band, and the like.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc. Also, it is appreciated that particular implementations of hardware and/or software components are merely illustrative, and other combinations of hardware and/or software that perform the methods described herein are within the scope of the disclosure.

It is appreciated that implementations of methods detailed herein are exemplary in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

What is claimed is:

1. An amplifier circuit comprising:
an amplifier configured to amplify an input signal to provide an output signal;
an amplifier stack comprising a first transistor coupled to the amplifier, the amplifier stack is configured to:
receive the output signal to amplify the output signal;
receive an input control signal to control the first transistor based on an envelope of the input signal;
an amplifier circuit output configured to provide an amplifier output signal based on the input signal received by the amplifier; and
a processor comprising an envelope detector to detect an envelope signal of a received signal, wherein the processor is configured to:
receive the amplifier output signal; and
adjust at least one of an amplitude or a phase of the envelope signal and provide the input control signal based on the adjusted envelope signal.

2. The amplifier circuit of claim 1,
wherein the received signal comprises the input signal received by the amplifier.

3. The amplifier circuit of claim 1,
wherein the processor is configured to adjust the amplitude and/or the phase of the envelope signal to align the envelope signal to the output signal.

4. The amplifier circuit of claim 1,
wherein the processor is configured to adjust the amplitude and/or the phase of the envelope signal to keep a cross voltage between the gate terminal and the source terminal of the first transistor substantially constant, and/or to reduce the cross voltage between the gate terminal and the drain terminal of the first transistor.

5. The amplifier circuit of claim 1, further comprising:
a plurality of amplifier stacks comprising
a first amplifier stack comprising the amplifier stack; and
a second amplifier stack configured to receive a second input control signal from the processor to control a first transistor of the second amplifier stack based on an envelope of the input signal.

6. The amplifier circuit of claim 5,
wherein the processor is configured to adjust the amplitude and/or the phase of the envelope signal to obtain the second input control signal which is different from the input control signal.

7. The amplifier circuit of claim 5,
wherein the processor is configured to:
receive the output signal from the amplifier;
adjust an amplitude and/or a phase of an envelope of the received output signal to obtain the second input control signal.

8. The amplifier circuit of claim 7,
wherein the first input control signal and the second input control signal are 180 degrees out of phase signals.

9. The amplifier circuit of claim 5, further comprising
an amplifier stack partial shunt circuit to limit a direct current (DC) flowing from the first amplifier stack to the second amplifier stack.

10. The amplifier circuit of claim 1,
wherein the input control signal is received by a gate terminal of the first transistor, and the first transistor is coupled to the amplifier by a source terminal.

11. The amplifier circuit of claim 10, further comprising
a low pass filter coupled between the processor and the gate terminal of the first transistor.

12. The amplifier circuit of claim 10,
wherein the processor is configured to adjust the amplitude and/or the phase of the envelope signal to keep a capacitance between the gate terminal and the source terminal of the first transistor substantially constant.

13. The amplifier circuit of claim 10,
wherein the amplifier stack comprises a second transistor configured to be coupled to the first transistor in a differential configuration; and
wherein the input control signal is received by a gate terminal of the second transistor.

14. The amplifier circuit of claim 10,
wherein the amplifier stack comprises a second transistor configured to be coupled to the first transistor in a differential configuration;
wherein the processor is configured to provide a second input control signal based on the envelope of the input signal; and
wherein the second input control signal is received by a gate terminal of the second transistor.

15. The amplifier circuit of claim 14,
wherein the amplifier comprises a differential transconductance amplifier comprising a first transistor and a second transistor, and a drain terminal of the first transistor of the amplifier is coupled to a source terminal of the first transistor of the amplifier stack, and a drain terminal of the second transistor of the amplifier is coupled to a source terminal of the second transistor of the amplifier stack.

16. The amplifier circuit of claim 1, further comprising
a partial shunt circuit to limit a DC current flowing from the amplifier to the amplifier stack.

17. The amplifier circuit of claim 1,
wherein the amplifier stack comprises a current source circuit comprising a current source transistor, wherein the first transistor of the amplifier stack comprises an N-type metal-oxide-semiconductor (NMOS), and the current source transistor comprises a P-type metal-oxide semiconductor (PMOS).

18. A mobile radio communication circuit comprising:
an up-converter configured to up-convert a baseband communication signal to a radio frequency (RF) communication signal; and
an amplifier circuit comprising:
an amplifier configured to amplify an input signal comprising the radio frequency (RF) communication signal to provide an output signal;
an amplifier stack comprising a first transistor coupled to the amplifier, the amplifier stack is configured to:
receive the output signal to amplify the output signal;
receive an input control signal to control the first transistor based on an envelope of the input signal;
an amplifier circuit output configured to provide an amplifier output signal based on the input signal received by the amplifier; and
a processor comprising an envelope detector to detect an envelope signal of a received signal, wherein the processor is configured to:
receive the amplifier output signal; and
adjust at least one of an amplitude or a phase of the envelope signal and provide the input control signal based on the adjusted envelope signal.

19. A mobile radio communication device comprising:
a mobile radio communication circuit comprising
an up-converter configured to up-convert a baseband communication signal to a radio frequency (RF) communication signal; and
an amplifier circuit comprising:
an amplifier configured to amplify an input signal comprising the radio frequency (RF) communication signal to provide an output signal;
an amplifier stack comprising a first transistor coupled to the amplifier, the amplifier stack is configured to:
receive the output signal to amplify the output signal;
receive an input control signal to control the first transistor based on an envelope of the input signal;
an amplifier circuit output configured to provide an amplifier output signal based on the input signal received by the amplifier;
an antenna configured to transmit the amplifier output signal;
an amplifier circuit output configured to provide an amplifier output signal based on the input signal received by the amplifier; and
a processor comprising an envelope detector to detect an envelope signal of a received signal, wherein the processor is configured to:
receive the amplifier output signal; and
adjust at least one of an amplitude or a phase of the envelope signal and provide the input control signal based on the adjusted envelope signal.

20. The mobile radio communication device of claim 19, further comprising:
a baseband processor configured to provide the baseband communication signal.

21. A method comprising:
amplifying an input signal to provide an output signal by an amplifier;
receiving the output signal by an amplifier stack comprising a first transistor coupled to the amplifier;
controlling the first transistor based on an envelope of the input signal;
amplifying the output signal using the first transistor providing an amplifier output signal based on the input signal received by the amplifier;
detecting an envelope signal of a received signal;
receiving, by a processor, the amplifier output signal; and
adjusting at least one of an amplitude or a phase of the envelope signal and providing the input control signal based on the adjusted envelope signal.

* * * * *